United States Patent
Tumanov et al.

(10) Patent No.: US 11,954,791 B2
(45) Date of Patent: Apr. 9, 2024

(54) FLUID SIMULATIONS USING ONE OR MORE NEURAL NETWORKS

(71) Applicant: Nvidia Corporation, Santa Clara, CA (US)

(72) Inventors: Evgenii Tumanov, Moscow (RU); Dmitry Korobchenko, Moscow (RU); Alexey Solovey, Los Gatos, CA (US)

(73) Assignee: Nvidia Corporation, Santa Clara, CA (US)

(*) Notice: Subject to any disclaimer, the term of this patent is extended or adjusted under 35 U.S.C. 154(b) by 0 days.

(21) Appl. No.: 17/751,360

(22) Filed: May 23, 2022

(65) Prior Publication Data

US 2022/0358710 A1  Nov. 10, 2022

Related U.S. Application Data

(63) Continuation of application No. 16/766,166, filed as application No. PCT/US2019/062551 on Nov. 21, 2019, now Pat. No. 11,341,710.

(51) Int. Cl.
*G06T 15/00* (2011.01)
*G06F 30/25* (2020.01)
(Continued)

(52) U.S. Cl.
CPC .............. *G06T 15/08* (2013.01); *G06F 30/25* (2020.01); *G06N 3/04* (2013.01); *G06N 3/08* (2013.01); *G06T 13/20* (2013.01); *G06T 2210/24* (2013.01)

(58) Field of Classification Search
CPC .......... G06F 30/27; G06F 30/25; G06F 30/28; G06T 15/08; G06T 2210/24; G06T 13/20; G06N 3/04; G06N 3/08; G06N 3/045
(Continued)

(56) References Cited

U.S. PATENT DOCUMENTS 5,615,677 A   4/1997  Pelc
8,437,990 B2  5/2013  Rodriguez
(Continued)

OTHER PUBLICATIONS

Tucci, Francesco Aldo. "Artificial intelligence for digital twins in energy systems and turbomachinery: development of machine learning frameworks for design, optimization and maintenance." (2023).*

(Continued)

*Primary Examiner* — Phu K Nguyen
(74) *Attorney, Agent, or Firm* — Hogan Lovells US LLP

(57) ABSTRACT

Approaches in accordance with various embodiments provide for fluid simulation with substantially reduced time and memory requirements with respect to conventional approaches. In particular, various embodiments can perform time and energy efficient, large scale fluid simulation on processing hardware using a method that does not solve for the Navier-Stokes equations to enforce incompressibility. Instead, various embodiments generate a density tensor and rigid body map tensor for a large number of particles contained in a sub-domain. Collectively, the density tensor and rigid body map may represent input channels of a network with three spatial-dimensions. The network may apply a series of operations to the input channels to predict an updated position and updated velocity for each particle at the end of a frame. Such approaches can handle tens of
(Continued)

millions of particles within a virtually unbounded simulation domain, as compared to classical approaches that solve for the Navier-Stokes equations.

20 Claims, 15 Drawing Sheets

(51) Int. Cl.
*G06N 3/04* (2023.01)
*G06N 3/08* (2023.01)
*G06T 13/20* (2011.01)
*G06T 15/08* (2011.01)

(58) Field of Classification Search
USPC .......................................................... 345/418
See application file for complete search history.

(56) References Cited

U.S. PATENT DOCUMENTS

| | | | |
|---|---|---|---|
| 8,452,721 B2 | 5/2013 | Cohen | |
| 8,892,408 B2 | 11/2014 | Sturdza | |
| 8,935,140 B2 | 1/2015 | Rodriguez | |
| 9,085,975 B2 | 7/2015 | Abad | |
| 9,087,411 B2* | 7/2015 | Chentanez | G06T 13/60 |
| 9,348,956 B2 | 5/2016 | Rodriguez | |
| 9,589,383 B2* | 3/2017 | Mueller-Fischer | G06T 13/20 |
| 10,296,672 B2 | 5/2019 | Rodriguez | |
| 10,503,845 B2 | 12/2019 | Stomakhin | |
| 2007/0239414 A1* | 10/2007 | Song | G06F 30/23 |
| | | | 703/9 |
| 2010/0224365 A1 | 9/2010 | Abad | |
| 2016/0246903 A1 | 8/2016 | Jacobs | |
| 2016/0307359 A1* | 10/2016 | Desbrun | G06F 30/20 |
| 2017/0185701 A1 | 6/2017 | Stomakhin | |
| 2020/0160750 A1* | 5/2020 | LiKamWa | G06T 13/20 |
| 2022/0027540 A1* | 1/2022 | Del Pin | G06F 30/25 |

OTHER PUBLICATIONS

Hu Y, Anderson L, Li TM, Sun Q, Carr N, Ragan-Kelley J, Durand F. Difftaichi: Differentiable programming for physical simulation. arXiv preprint arXiv:1910.00935. Oct. 1, 2019.*

Xiao X, Zhou Y, Wang H, Yang X. A novel CNN-based Poisson solver for fluid simulation. IEEE transactions on visualization and computer graphics. Sep. 30, 2018;26(3):1454-65.*

Macklin M, Storey K, Lu M, Terdiman P, Chentanez N, Jeschke S, Müller M. Small steps in physics simulation. InProceedings of the 18th Annual ACM SIGGRAPH/Eurographics Symposium on Computer Animation Jul. 26, 2019 (pp. 1-7).*

International Search Report and Written Report issued in PCT Application Serial No. PCT/US19/62551 dated Jan. 14, 2020.

Non-Final Rejection issued in U.S. Appl. No. 16/766,166 dated Jul. 22, 2021.

Notice of Allowance issued in U.S. Appl. No. 16/766,166 dated Feb. 9, 2022.

Tompson, J., et al., "Accelerating Eulerian Fluid Simulation With Convolutional Networks," International Conference on Machine Learning Jul. 1, 20177 (pp. 3424-3433) PMLR.

Kim, B., et al., "A Generative Network for Parameterized Fluid Simulations," Computer Graphics Forum May 2019 (vol. 38, No. 2, pp. 59-70).

Dieppedalle, et al., "Final Project: 3D Position Based Fluid Simulation and Surfacing," CS 184: Computer Graphics and Imaging, Spring 2018; https://yidingjiang.github.io/cs 184sp 18_final/.

Macklin, M. and Müller, M., "Position Based Fluids," ACM Transactions on Graphics (TOG) Jul. 21, 2013; 32(4): 1-2.

Macklin, M., et al., "Unified Particle Physics for Real-Time Applications," ACM Transactions on Graphics (TOG) Jul. 27, 2014; 33(4): 1-2.

Schenck, C., et al., "Differentiable Fluid Dynamics for Deep Neural Networks," Conference on Robot Learning Oct. 23, 2018 (pp. 317-335) PMLR.

* cited by examiner

FLUID SIMULATIONS USING ONE OR MORE NEURAL NETWORKS

CROSS-REFERENCE TO RELATED APPLICATIONS

This application is a continuation of U.S. Patent Application U.S. patent application Ser. No. 16/766,166, filed May 21, 2020, entitled "FLUID SIMULATIONS USING ONE OR MORE NEURAL NETWORKS," which claims priority to PCT Application Serial No. PCT/US19/62551, filed Nov. 21, 2019, entitled "FLUID SIMULATIONS USING ONE OR MORE NEURAL NETWORKS," the full disclosures of which are hereby incorporated herein by reference in their entireties for all purposes.

BACKGROUND

Fluid simulation is a long standing problem in computer graphics, applied mathematics, and other fields. Computing high-resolution fluid simulations using traditional techniques is challenging in that fluid simulations require an undesirable amount of computational resources to compute a scene with a large number of water particles, such as a scene with a river or body of water. The main computational bottleneck is associated with a time step size that is small enough to provide stability. The simulation time for fluid simulations using traditional techniques may be in the range of hours to days, and hence, may be unable to achieve high-resolution fluid simulation in real-time. Consequently, computing high-resolution fluid simulation using traditional techniques may be impractical for certain use cases, such as computer simulations and video games.

BRIEF DESCRIPTION OF THE DRAWINGS

Various embodiments in accordance with the present disclosure will be described with reference to the drawings, in which.

DETAILED DESCRIPTION

Figure 1:
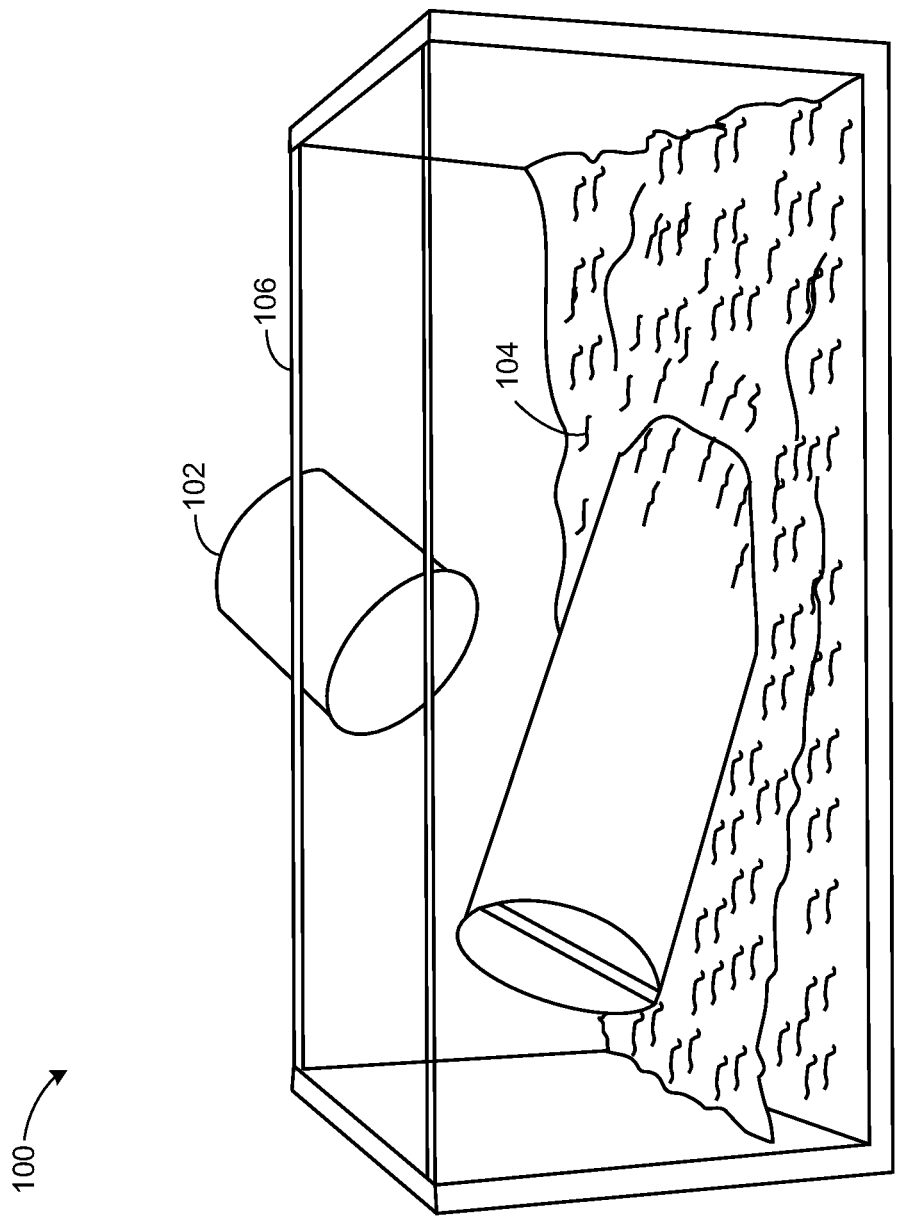
FIG. 1 illustrates an example of a fluid simulation for a computer graphics application that can be performed in accordance with various embodiments.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

As mentioned above, fluid simulation is a long standing problem in computer graphics, applied mathematics, and other fields due to the computational bottleneck caused by the time step size needed for high resolution fluid simulation in real-time. Conventional approaches to fluid simulation include the Eulerian computational paradigm (grid based) and the Lagrangian computational paradigm (particle based). Methods that perform fluid simulation using the Eulerian computational paradigm operate with scalar and vector physical fields on a regular grid, and by solving the Navier-Stokes equations for pressure, viscosity, surface tension, and incompressibility. Methods that operate using the Lagrangian computational paradigm approximate continuous quantities in the Navier-Stokes equations with quantities known at discrete entities called particles.

While incompressibility can be enforced in a fluid simulation using the Navier-Stokes equations, these computations are very time consuming, and hence, may be impractical for use in real time-fluid simulation. Thus, there is a need to compute high-resolution fluid simulations that enforces the incompressibility of a fluid without solving for the Navier-Stokes equations.

Approaches in accordance with various embodiments provide for fluid simulation with substantially reduced time and memory requirements with respect to conventional approaches. In particular, various embodiments generate a density tensor and rigid body map tensor for a large number of particles contained in a given sub-domain of a particle domain. The density tensor may be represented in a number of different formats, and may include NVIDIA® GVDB Voxels. The rigid body map tensor may be represented as a binary determination of which of the NVIDIA® GVDB Voxels in the density tensor are covered by a rigid body in during a particular frame in a simulated scene. Collectively, the density tensor and rigid body map may represent input channels of a network (e.g., a trained neural network) with three spatial-dimensions. The network may apply a series of operations (e.g., convolutions, dilated convolutions, three-dimensional 5 pixel shuffling, etc.) to the input channels to predict an updated position and updated velocity for each particle at the end of a frame. Such approaches can handle tens of millions of particles within a virtually unbounded simulation domain, as compared to classical approaches that solve for the Navier-Stokes equations. Data in some embodiments can be collected using a Position Based Fluids method, although other solvers can be used as well within the scope of various embodiments.

Various other functions can be implemented within the various embodiments as well as discussed and suggested elsewhere herein.

Figure 2:
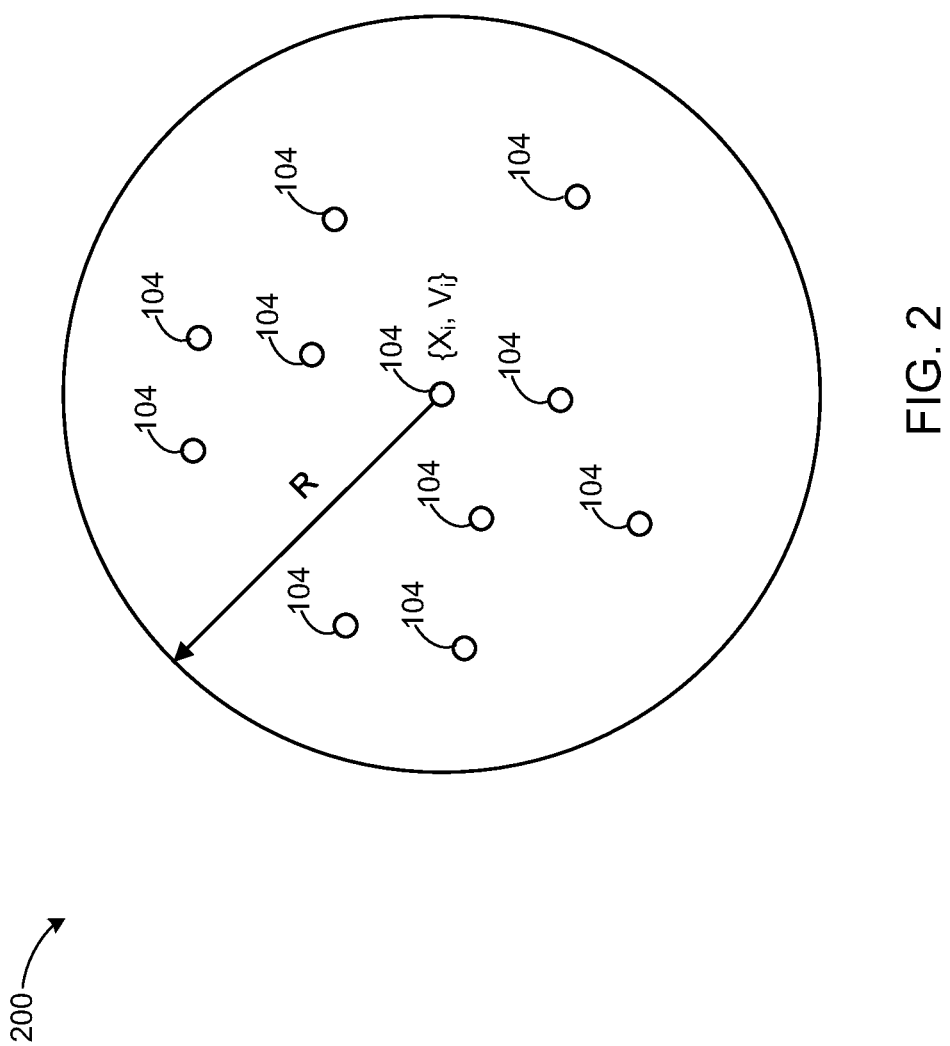
FIG. 2 illustrates an example fluid incompressibility constraint that can be utilized in accordance with various embodiments.

As mentioned, it may be desirable in various instances to perform a high-resolution fluid simulation in real-time. For example, as illustrated in the example image 100 of FIG. 1, a computer graphics application for a movie or video game might involve a display objects 102 dropping into or moving through a body or basin 106 of water. While "basin" is used in various examples, it should be understood that a particle domain can be split into a number of sub-domains through which objects can move through. In at least some embodiments, as discussed in more detail elsewhere herein, density and rigid body masks can be constructed, and a network run, for each sub-domain in various embodiments, and these tasks are not limited to a specific basin. In order to model and render the movement and displacement of water in a realistic fashion, a particle simulation can be used wherein "droplets" of water are modeled as individual particles 104 and the behavior of the particles is determined by the particle simulation, which can take into account factors such as the positions, velocities, and incompressibility of the various particles. In many instances, the simulation can be performed on one or more processors, such as a set of graphics processing units (GPUs). As mentioned, a high-resolution fluid simulation can be performed on GPU hardware using a methodology that enforces the incompressibility of the fluid without solving for the Navier-Stokes equations. A simulation might involve tens of millions of particles within a virtually unbounded simulation domain. In some embodiments, the fluid can be modeled using an incompressibility constraint m that dictates that when at rest ($x_i=0$, $v_i=0$), the number of particles located within radius R from one another cannot be larger than m. As illustrated in the example image 200 in FIG. 2, the incompressibility constraint m is that no more than 10 particles can be located within radius R from any one particle 104 when at rest. However, other incompressibility constraints may be used without departing from the scope of the present disclosure.

When a fluid is simulated as a large set of particles, each particle may have vector quantities of position and velocity associated therewith. In some embodiments, the fluid simulation may be divided into a set of steps that may be performed for each frame of a scene being rendered. The set of steps may be performed to update the position and velocity for each of the particles throughout the duration of a frame. At the end of a frame, the updated positions and velocities may be used as the initial positions and velocities for the particles during the subsequent frame. Details associated with each of the steps are set forth below in connection with FIGS. 3A-6.

At the beginning of a frame n, the one or more processors may determine a motion, also referred to as an advection in some embodiments, of individual particles 104 that is caused by the flow of the bulk fluid being simulated. As seen below, the velocity ($v_i^{n*}$) may be determined for particle i in frame n using equation 1, and the position ($x_i^{n*}$) for particle i at frame n may be determined using equation 2. As seen in equation 1, velocity ($v_i^{n*}$) may be equal to the initial velocity ($v_i^{n*}$) for particle i at the start of frame n plus the sum of external forces (e.g., gravity, viscosity, surface tension, pressure, etc.) during time period $\Delta t$, where time period $\Delta t$ is the duration of a frame. For example, if a scene is run at 60 frames/second, then time period $\Delta t$ is equal to 16.6 ms.

As seen in equation 2, the position ($x_i^{n*}$) may be equal to the initial velocity ($v_i^{n*}$) of particle i (e.g., at the start of frame n) plus an average of the initial velocity ($v_i^{n*}$) and the velocity ($v_i^{n*}$) during time period $\Delta t$, where time period $\Delta t$ is the duration of frame n. The one or more processors may maintain a particle positions table the correlates one or more of the velocity ($v_i^{n*}$) and position ($x_i^{n*}$) for each of the particles 104 in relation to all of the other particles 104 in frame n. Once the velocity ($v_i^{n*}$) and the position ($x_i^{n*}$) for each of the particles are determined, the one or more processors may perform collision detection, as seen below in equation 3. In certain implementations, the one or more processors may perform collision detection by estimating viscosity and surface tension on a grid using, for example, signed distance fields (SDFs).

$$v_i^{n*} = v_i^n + f_{ext}\Delta t \qquad \text{equation 1}$$

$$x_i^{n*} = x_i^n + \frac{v_i^{n*} + v_i^n}{2}\Delta t \qquad \text{equation 2}$$

$$x_i^{n*} = CollisionDetection(x_i^{n*}) \qquad \text{equation 3}$$

To determine a final velocity ($v_i^{n+1}$) and final position ($x_i^{n+1}$) for particle i at the end of frame n (e.g., which is also the initial velocity of particle i at the start of frame n+1), the one or more processors may determine a correction factor ($\delta_i^n$) in order to account for any other forces acting on the particles 104 during frame n. The other forces may include, for example, an object falling into the basin 106. For example, in frame n a ball begins falling into the basin 106 and colliding with a set of particles 104. In order to provide a realistic high-resolution fluid simulation, the one or more processors determine a correction factor $\delta$ in order to predict and display the movement of water caused by the force imparted on the set of particles 104 by the falling object.

As seen below, the final velocity ($v_i^{n+1}$) may be determined for particle i in frame n using equation 4, and the final position ($x_i^{n*}$) for particle i in frame n using equation 5. As seen in equation 4, the final velocity ($v_i^{n+1}$) may be equal to the velocity ($v_i^{n*}$) for particle i in frame n plus a correction factor ($\delta_i^n$). As seen in equation 5, the final position ($x_i^{n+1}$) for particle i at the end of frame n may be equal to the position ($x_i^{n*}$) plus half of the correction factor ($\delta_i^n$) during time period $\Delta t$, where time period $\Delta t$ is the duration of frame n.

$$v_i^{n+1} = v_i^{n*} + \delta_i^n \qquad \text{equation 4}$$

$$x_i^{n+1} = x_i^{n*} + \frac{\delta_i^n}{2}\Delta t \qquad \text{equation 5}$$

In order to obtain the correction factor 6 for each of the particles 104, the one or more processors may generate a density tensor and a rigid body mask tensor. The density tensor and the rigid body mask tensor may represent the input channels of a network (e.g., described below in connection with FIG. 4) that determines the correction factor 6 for each of the particles 104 in frame n.

Figure 3A:
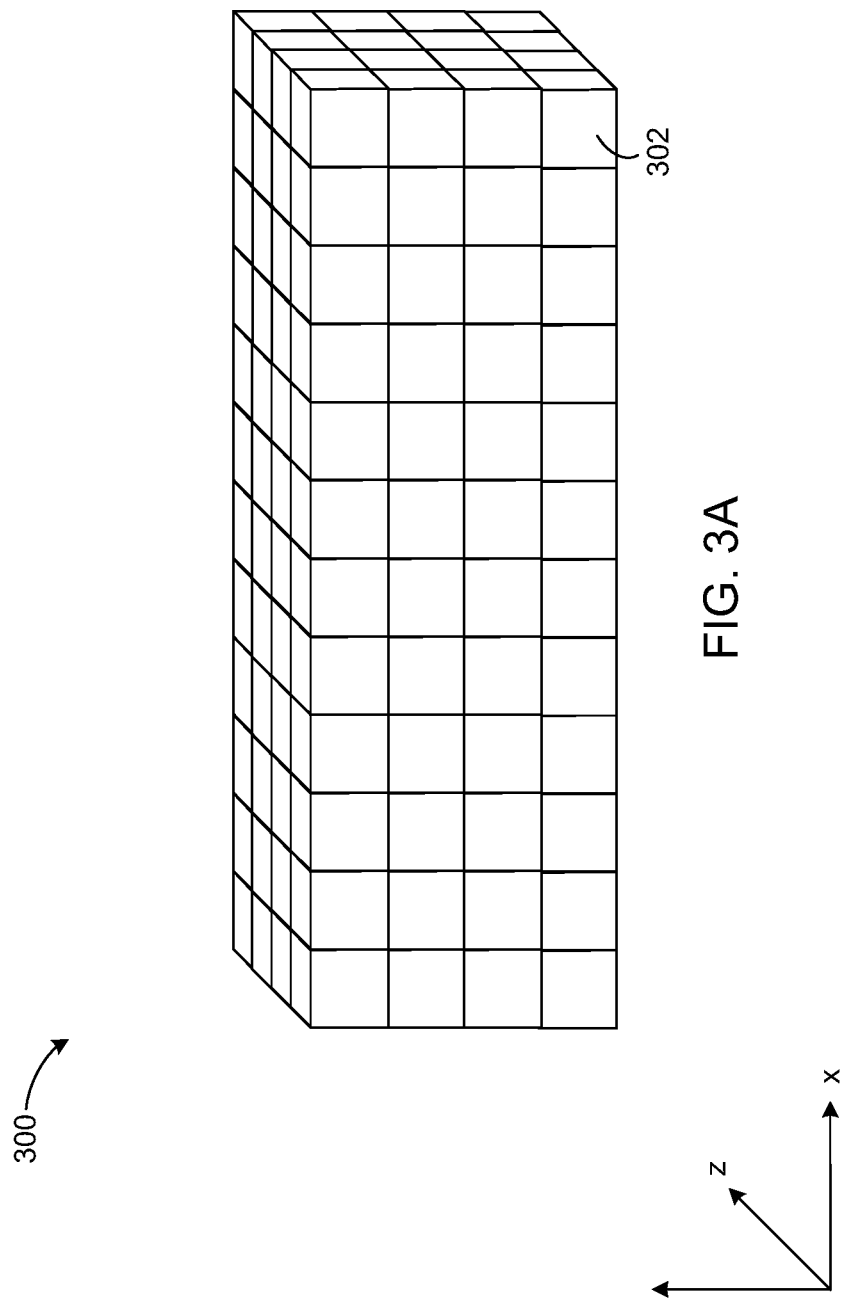
FIG. 3A illustrates an example approach to generating a density tensor that can be utilized in accordance with various embodiments.

For example, the one or more processors may spatially divide the basin 106, or the region in the basin 106 containing particles 104, into equal voxels 302, as illustrated in the example image 300 in FIG. 3A. In certain implementations, each voxel 302 may be a cube with a width, height, and depth equal to radius R described above in connection with the incompressibility constraint m. The one or more processors may determine the number of particles in each voxel 302 as an ordinary sum, or a weighted sum, as may be based at least in part on the determined velocity ($v_i^{n*}$) and the position ($x_i^{n*}$) for each of the particles 104, as well as the incompressibility constraint m. The number of particles 104 in each voxel 302 may represent the density tensor.

Figure 3B:
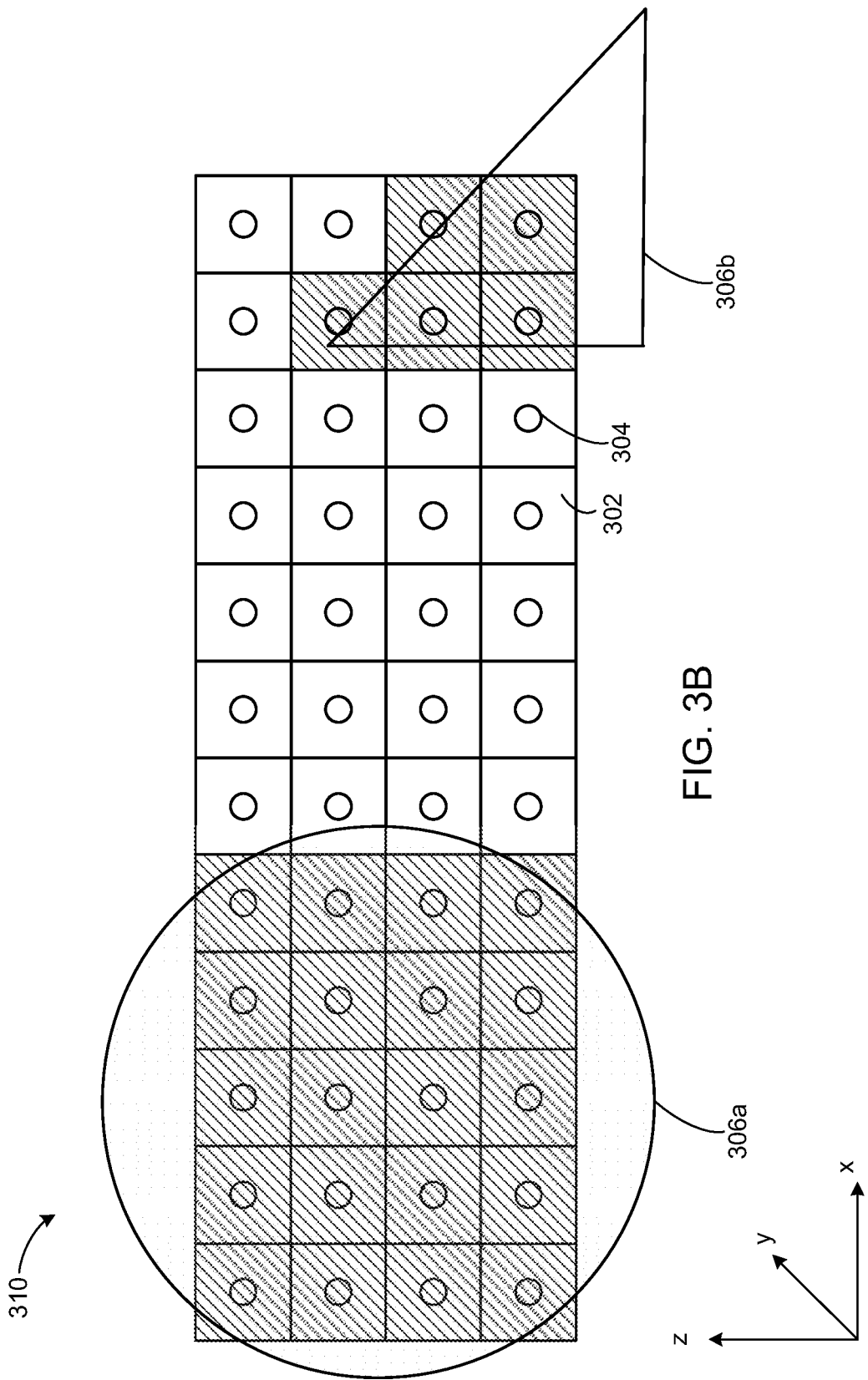
FIG. 3B illustrates an example rigid body mask tensor that can be utilized in accordance with various embodiments.

In some embodiments, the one or more processors may obtain the rigid bodies mask tensor 404 by determining whether a rigid body 306a, 306b covers the center point 304 of any of the voxels 302 in frame n, as illustrated in the example image 310 in FIG. 3B. The example image 310 in FIG. 3B is a top down view of the topmost layer of voxels 302 in the y-direction in the example image 300 of FIG. 3A. All voxels 302 that share a center point axis in the y-direction under a topmost layer voxel 302 with a center point 304 that is covered by a rigid body 306a, 306b may also be considered to be covered by the rigid body 306a, 306b. In some embodiments, the one or more processors may obtain the rigid body mask tensor by assigning a first value (e.g., 1) to each of the voxels 302 with a center point 304 that is covered by a rigid body 306a, 306b, and a second value (e.g., 0) to each of the voxels 302 with a center point 304 that remains uncovered by a rigid body 306a, 306b in frame n.

Figure 4:
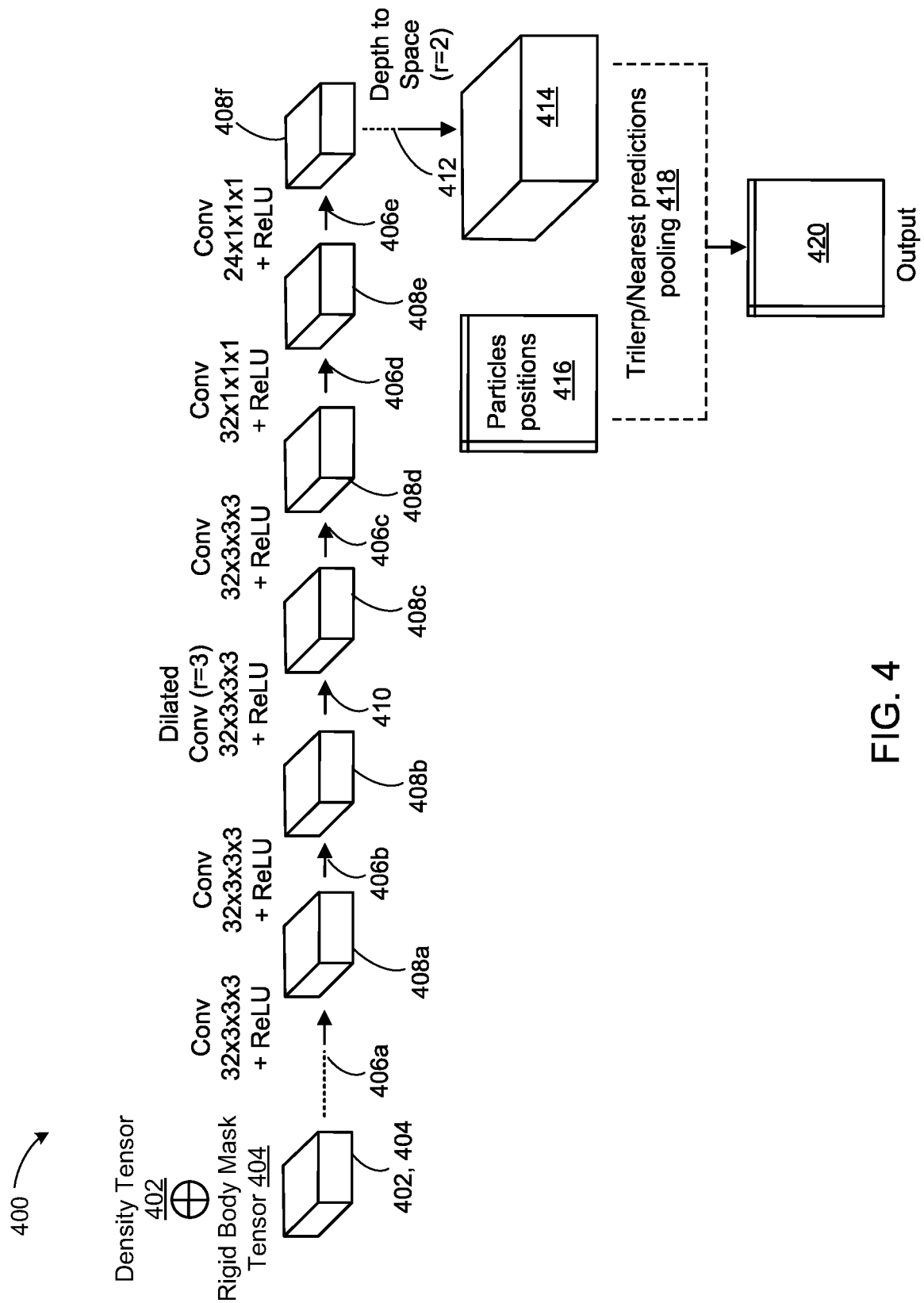
FIG. 4 illustrates an example network that can be utilized in accordance with various embodiments.

As mentioned above, the density tensor 402 and a rigid body mask tensor 404 may each represent a single input channel into an example network 400, as illustrated in the example image of FIG. 4. Each voxel in the density tensor 402 may contain information about one or more of the density of particles 104, the position of particles 104, or velocity of particles 104 located within that voxel during frame n. The rigid body mask tensor 404 may designate each voxel with a 1 or a 0 to indicate which voxels that are covered by a rigid body 306a, 306b, as described above in connection with FIG. 3B. The density tensor 402 and the rigid body mask tensor 404 may be padded with 0s along the x-direction, y-direction, and z-direction, for example, to maintain the same dimensions for the output channel after applying a convolution.

In the example network 400 illustrated in FIG. 4, the one or more processors may apply a series of convolutions 406a, 406b to the density tensor 402 and rigid body mask tensor 404 input channels. The convolution 406a may have, for example, 32 filters of kernel size 3×3×3, which outputs a features map 408a with 32 channels. A second convolution 406b with, for example, 32 filters of kernel size 3×3×3 may be applied to the features map 408a, which may output a second features map 408b with 32 channels. The one or more processors may apply a dilated convolution 410 with, for example, with 32 filters of kernel size 3×3×3 to the second features map 408b, and output a third features map 408c with 32 channels. The dilated convolution 410 may provide an increased receptive view of the network 400 and the information contained in the density tensor 402 and the rigid body mask tensor 404. The one or more processors may apply another convolution 406c with, for example, 32 filters of kernel size 3×3×3 to the third features map 408c and output a fourth features map 408d. Another convolution 406d with, for example, 32 channels of kernel size 1×1×1 may be applied to the fourth features map 408d, and output a fifth features map 408e with 32 channels. Another convolution 406e with, for example, 24 channels of kernel size 1×1×1 may be applied to the fifth features map 408e, and output a sixth features map 408f with 24 channels. The sixth features map 408f may have dimensions of D×H×W×C·$r^3$, where D, H, and W are the spatial dimensions, C is a constant, and $r^3$ is the number of channels.

Figure 5:
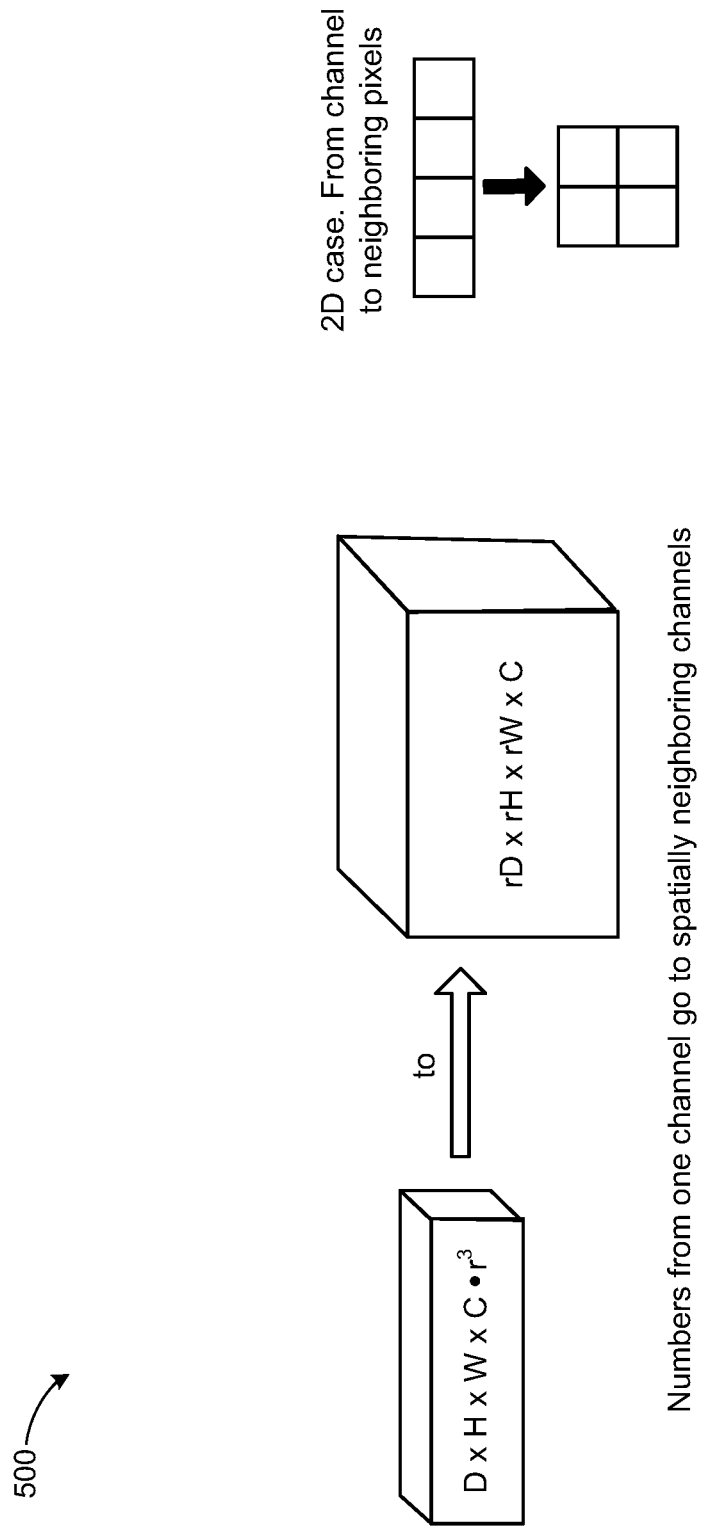
FIG. 5 illustrates an example inner depth-to-space operation that can be performed in accordance with various embodiments.

In order to obtain information about spatially neighboring channels in the sixth features map 408f, the one or more processors may perform a depth-to-space operation 412 in which information from one channel is related to spatially neighboring channels, as seen in the example image 500 of FIG. 5. The depth-to-space operation 412 may produce a seventh features map 414 with dimensions rD×rH×rW×C. The one or more processors may perform nearest predictions pooling 418 based on information in the particle positions map 416 and the seventh features map 414. The nearest predictions pooling 418 may output a table 420 with correction factors 6 for each of the particles 104 in frame n.

In some embodiments, the one or more processors may determine the final velocity ($v_i^{n+1}$) and the final position ($x_i^{n+1}$), respectively using equations 4 and 5 above, and the correction factors 6 listed in the table 420. By extracting channels of information from the density tensor 402 and the rigid body mask tensor 404 using the network described in connection with FIG. 4, the one or more processors of the present disclosure may perform high-resolution fluid simulation without solving for the Navier-Stokes equations, and hence, be used in real-time.

Figure 6:
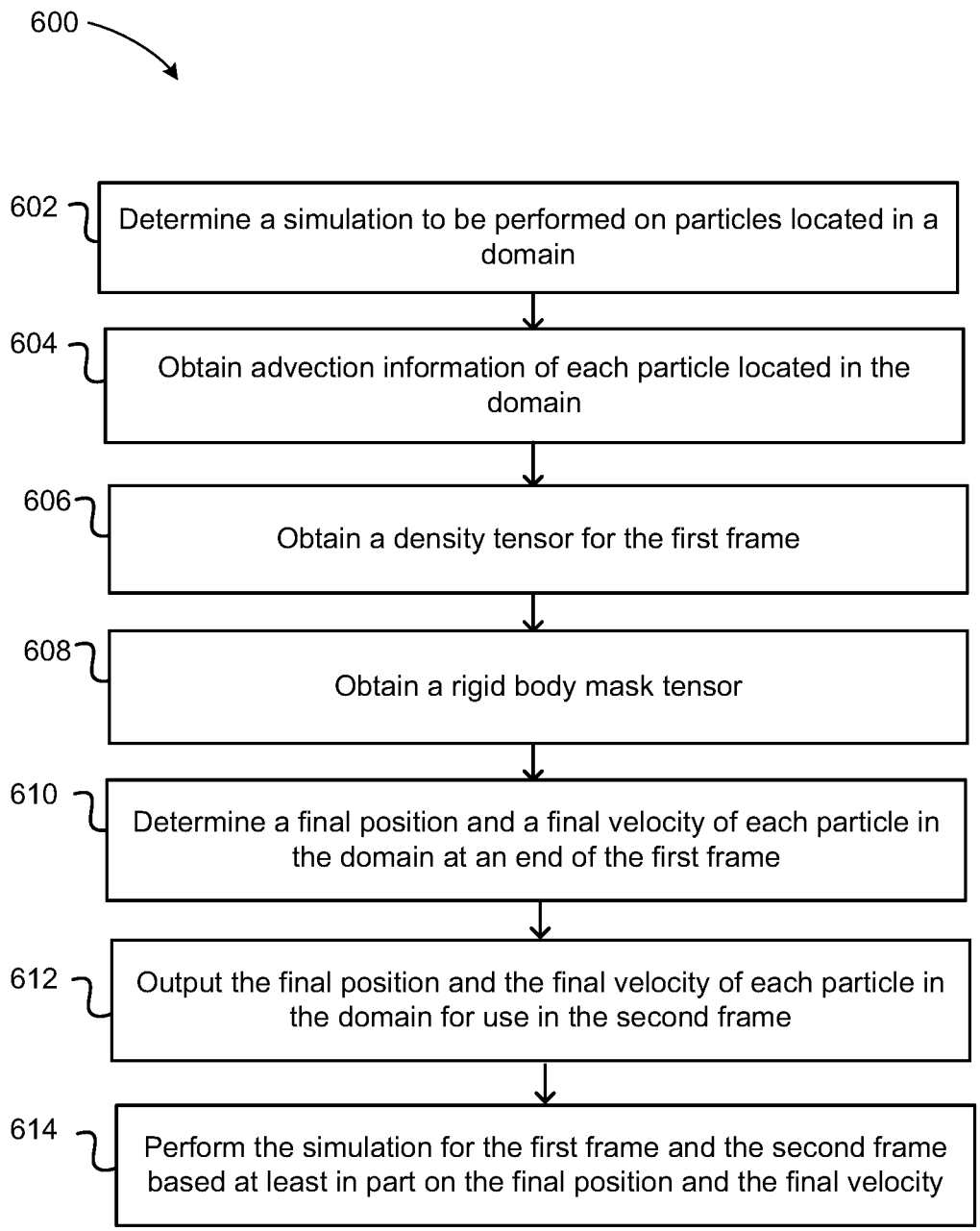
FIG. 6 illustrates a first example process for performing a simulation that can be utilized in accordance with various embodiments.

FIG. 6 illustrates an example process 600 for performing a simulation that can be utilized in accordance with various embodiments. It should be understood for this and other processes discussed herein that there can be additional, alternative, or fewer steps performed in similar or alternative orders, or in parallel, within the scope of the various embodiments unless otherwise stated. Further, although fluid simulations are utilized as a primary use case for description purposes, various other simulations and applications can take advantage of aspects of the various embodiments as discussed and suggested herein, as may relate to hair simulation and the like. In this example, a particle simulation to be performed is determined 602. This can include, for example, determining a fluid simulation to be performed as part of a computer graphics application, among other such options. Motion information associated with each particle located in a basin or domain may be determined 604, such as is described above in connection with equations 1-3. A density tensor for frame n may be obtained 604 or generated, such as described above in connection with FIG. 3A. The density tensor may represent the positions and/or velocities of all particles with respect to voxels. A rigid body mask may be obtained 606 or generated for frame n, such as is described above in connection with FIG. 3B. The final position and final velocity for each of the particles in frame n may be determined 610, such as described above in connection with equations 4-5 and FIG. 4. The final position and final velocity for each of the particles in frame n may be output for use as the initial velocity and initial position in frame n+1, as described above in connection with equations 4-5 and FIG. 4.

The simulation for the first and second frames may be performed based, at least in part, on the final velocity and final position determined for each of the particles.

Inference and Training Logic

Figure 7:
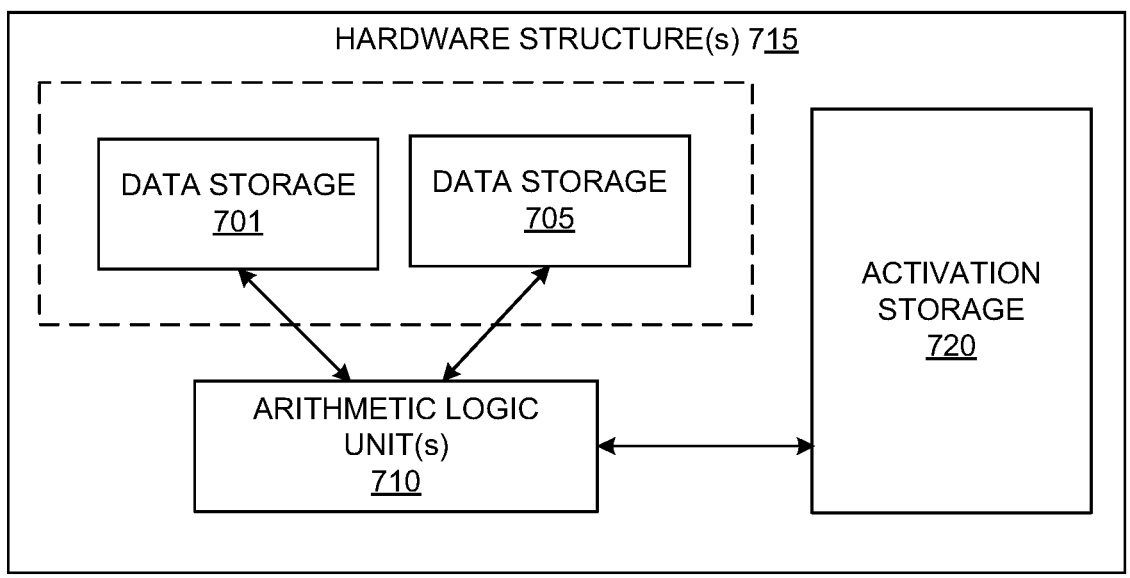
FIG. 7 illustrates inference and/or training logic, according to at least one embodiment.

FIG. 7 illustrates inference and/or training logic 715 used to perform inferencing and/or training operations associated with at least one embodiment. Details regarding inference and/or training logic 715 are provided below in conjunction with FIGS. 7 and 8.

In at least one embodiment, inference and/or training logic 715 may include, without limitation, code and/or data storage 701 to store forward and/or output weight and/or input/output data, and/or other parameters to configure neurons or layers of a neural network trained and/or used for inferencing in aspects of one or more embodiments. In at least one embodiment, training logic 715 may include, or be coupled to code and/or data storage 701 to store graph code or other software to control timing and/or order, in which weight and/or other parameter information is to be loaded to configure, logic, including integer and/or floating point units (collectively, arithmetic logic units (ALUs). In at least one embodiment, code, such as graph code, loads weight or other parameter information into processor ALUs based on an architecture of a neural network to which this code corresponds. In at least one embodiment, code and/or data storage 701 stores weight parameters and/or input/output data of each layer of a neural network trained or used in conjunction with one or more embodiments during forward propagation of input/output data and/or weight parameters during training and/or inferencing using aspects of one or more embodiments. In at least one embodiment, any portion of code and/or data storage 701 may be included with other on-chip or off-chip data storage, including a processor's L1, L2, or L3 cache or system memory.

In at least one embodiment, any portion of code and/or data storage 701 may be internal or external to one or more processors or other hardware logic devices or circuits. In at least one embodiment, code and/or data storage 701 may be cache memory, dynamic randomly addressable memory ("DRAM"), static randomly addressable memory ("SRAM"), non-volatile memory (e.g., Flash memory), or other storage. In at least one embodiment, choice of whether code and/or data storage 701 is internal or external to a processor, for example, or comprised of DRAM, SRAM, Flash or some other storage type may depend on available storage on-chip versus off-chip, latency requirements of training and/or inferencing functions being performed, batch size of data used in inferencing and/or training of a neural network, or some combination of these factors.

In at least one embodiment, inference and/or training logic 715 may include, without limitation, a code and/or data storage 705 to store backward and/or output weight and/or input/output data corresponding to neurons or layers of a neural network trained and/or used for inferencing in aspects of one or more embodiments. In at least one embodiment, code and/or data storage 705 stores weight parameters and/or input/output data of each layer of a neural network trained or used in conjunction with one or more embodiments during backward propagation of input/output data and/or weight parameters during training and/or inferencing using aspects of one or more embodiments. In at least one embodiment, training logic 715 may include, or be coupled to code and/or data storage 705 to store graph code or other software to control timing and/or order, in which weight and/or other parameter information is to be loaded to configure, logic, including integer and/or floating point units (collectively, arithmetic logic units (ALUs). In at least one embodiment, code, such as graph code, loads weight or other parameter information into processor ALUs based on an architecture of a neural network to which this code corresponds. In at least one embodiment, any portion of code and/or data storage 705 may be included with other on-chip or off-chip data storage, including a processor's L1, L2, or L3 cache or system memory. In at least one embodiment, any portion of code and/or data storage 705 may be internal or external to on one or more processors or other hardware logic devices or circuits. In at least one embodiment, code and/or data storage 705 may be cache memory, DRAM, SRAM, non-volatile memory (e.g., Flash memory), or other storage. In at least one embodiment, choice of whether code and/or data storage 705 is internal or external to a processor, for example, or comprised of DRAM, SRAM, Flash or some other storage type may depend on available storage on-chip versus off-chip, latency requirements of training and/or inferencing functions being performed, batch size of data used in inferencing and/or training of a neural network, or some combination of these factors.

In at least one embodiment, code and/or data storage 701 and code and/or data storage 705 may be separate storage structures. In at least one embodiment, code and/or data storage 701 and code and/or data storage 705 may be same storage structure. In at least one embodiment, code and/or data storage 701 and code and/or data storage 705 may be partially same storage structure and partially separate storage structures. In at least one embodiment, any portion of code and/or data storage 701 and code and/or data storage 705 may be included with other on-chip or off-chip data storage, including a processor's L1, L2, or L3 cache or system memory.

In at least one embodiment, inference and/or training logic 715 may include, without limitation, one or more arithmetic logic unit(s) ("ALU(s)") 910, including integer and/or floating point units, to perform logical and/or mathematical operations based, at least in part on, or indicated by, training and/or inference code (e.g., graph code), a result of which may produce activations (e.g., output values from layers or neurons within a neural network) stored in an activation storage 820 that are functions of input/output and/or weight parameter data stored in code and/or data storage 801 and/or code and/or data storage 805. In at least one embodiment, activations stored in activation storage 820 are generated according to linear algebraic and or matrix-based mathematics performed by ALU(s) in response to performing instructions or other code, wherein weight values stored in code and/or data storage 805 and/or code and/or data storage 801 are used as operands along with other values, such as bias values, gradient information, momentum values, or other parameters or hyperparameters, any or all of which may be stored in code and/or data storage 805 or code and/or data storage 801 or another storage on or off-chip.

In at least one embodiment, ALU(s) are included within one or more processors or other hardware logic devices or circuits, whereas in another embodiment, ALU(s) may be external to a processor or other hardware logic device or circuit that uses them (e.g., a co-processor). In at least one embodiment, ALUs may be included within a processor's execution units or otherwise within a bank of ALUs accessible by a processor's execution units either within same processor or distributed between different processors of different types (e.g., central processing units, graphics processing units, fixed function units, etc.). In at least one embodiment, code and/or data storage 801, code and/or data storage 805, and activation storage 820 may be on same processor or other hardware logic device or circuit, whereas in another embodiment, they may be in different processors or other hardware logic devices or circuits, or some combination of same and different processors or other hardware logic devices or circuits. In at least one embodiment, any portion of activation storage 820 may be included with other on-chip or off-chip data storage, including a processor's L1, L2, or L3 cache or system memory. Furthermore, inferencing and/or training code may be stored with other code accessible to a processor or other hardware logic or circuit and fetched and/or processed using a processor's fetch, decode, scheduling, execution, retirement and/or other logical circuits.

In at least one embodiment, activation storage 820 may be cache memory, DRAM, SRAM, non-volatile memory (e.g., Flash memory), or other storage. In at least one embodiment, activation storage 820 may be completely or partially within or external to one or more processors or other logical circuits. In at least one embodiment, choice of whether activation storage 820 is internal or external to a processor, for example, or comprised of DRAM, SRAM, Flash or some other storage type may depend on available storage on-chip versus off-chip, latency requirements of training and/or inferencing functions being performed, batch size of data used in inferencing and/or training of a neural network, or some combination of these factors. In at least one embodiment, inference and/or training logic 715 illustrated in FIG. 8 may be used in conjunction with an application-specific integrated circuit ("ASIC"), such as Tensorflow® Processing Unit from Google, an inference processing unit (IPU) from Graphcore™, or a Nervana® (e.g., "Lake Crest") processor from Intel Corp. In at least one embodiment, inference and/or training logic 715 illustrated in FIG. 8 may be used in conjunction with central processing unit ("CPU") hardware, graphics processing unit ("GPU") hardware or other hardware, such as field programmable gate arrays ("FPGAs").

Figure 8:
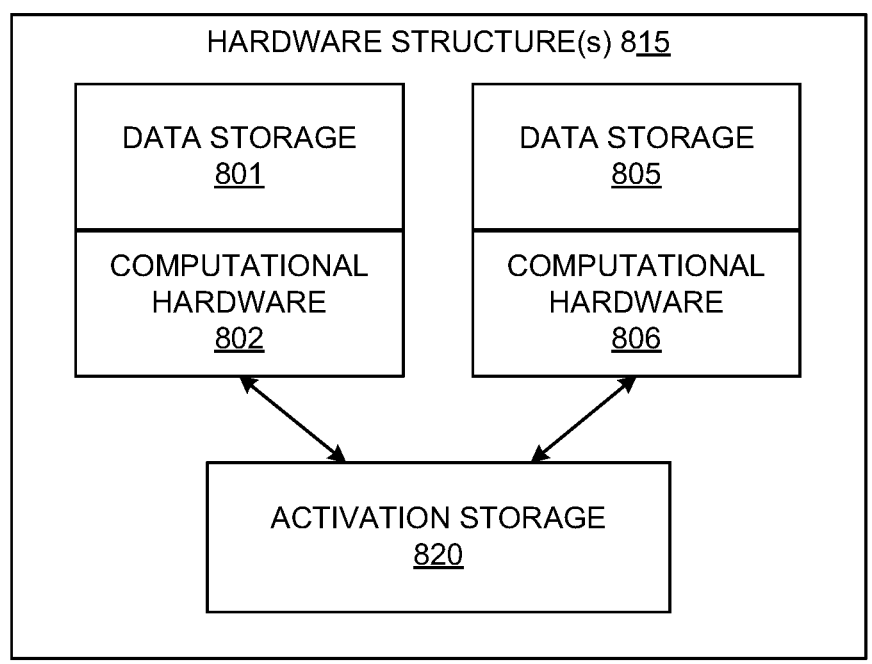
FIG. 8 illustrates inference and/or training logic, according to at least one embodiment.

FIG. 8 illustrates inference and/or training logic 815, according to at least one or more embodiments. In at least one embodiment, inference and/or training logic 815 may include, without limitation, hardware logic in which computational resources are dedicated or otherwise exclusively used in conjunction with weight values or other information corresponding to one or more layers of neurons within a neural network. In at least one embodiment, inference and/or training logic 815 illustrated in FIG. 8 may be used in conjunction with an application-specific integrated circuit (ASIC), such as Tensorflow® Processing Unit from Google, an inference processing unit (IPU) from Graphcore™, or a Nervana® (e.g., "Lake Crest") processor from Intel Corp. In at least one embodiment, inference and/or training logic 815 illustrated in FIG. 8 may be used in conjunction with central processing unit (CPU) hardware, graphics processing unit (GPU) hardware or other hardware, such as field programmable gate arrays (FPGAs). In at least one embodiment, inference and/or training logic 815 includes, without limitation, code and/or data storage 801 and code and/or data storage 805, which may be used to store code (e.g., graph code), weight values and/or other information, including bias values, gradient information, momentum values, and/or other parameter or hyperparameter information. In at least one embodiment illustrated in FIG. 8, each of code and/or data storage 801 and code and/or data storage 805 is associated with a dedicated computational resource, such as computational hardware 802 and computational hardware 806, respectively. In at least one embodiment, each of computational hardware 802 and computational hardware 806 comprises one or more ALUs that perform mathematical functions, such as linear algebraic functions, only on information stored in code and/or data storage 801 and code and/or data storage 805, respectively, result of which is stored in activation storage 820.

In at least one embodiment, each of code and/or data storage 801 and 805 and corresponding computational hardware 802 and 806, respectively, correspond to different layers of a neural network, such that resulting activation from one "storage/computational pair 801/802" of code and/or data storage 801 and computational hardware 802 is provided as an input to "storage/computational pair 805/806" of code and/or data storage 805 and computational hardware 806, in order to mirror conceptual organization of a neural network. In at least one embodiment, each of storage/computational pairs 801/802 and 805/806 may correspond to more than one neural network layer. In at least one embodiment, additional storage/computation pairs (not shown) subsequent to or in parallel with storage computation pairs 801/802 and 805/806 may be included in inference and/or training logic 815.

Inference and training logic such at that discussed with respect to FIG. 8 can be used to train one or more neural networks to analyze a media stream or file of video data, as may correspond to gameplay data. These neural networks, which can run on described hardware structures 815, can be used for inferencing for detecting objects or occurrences, as well as inferring types of events based upon data for these detected objects or occurrences. Different neural networks or machine learning models can be trained for different games, types of game, types of video content, or types of events, among other such options.

Data Center

Figure 9:
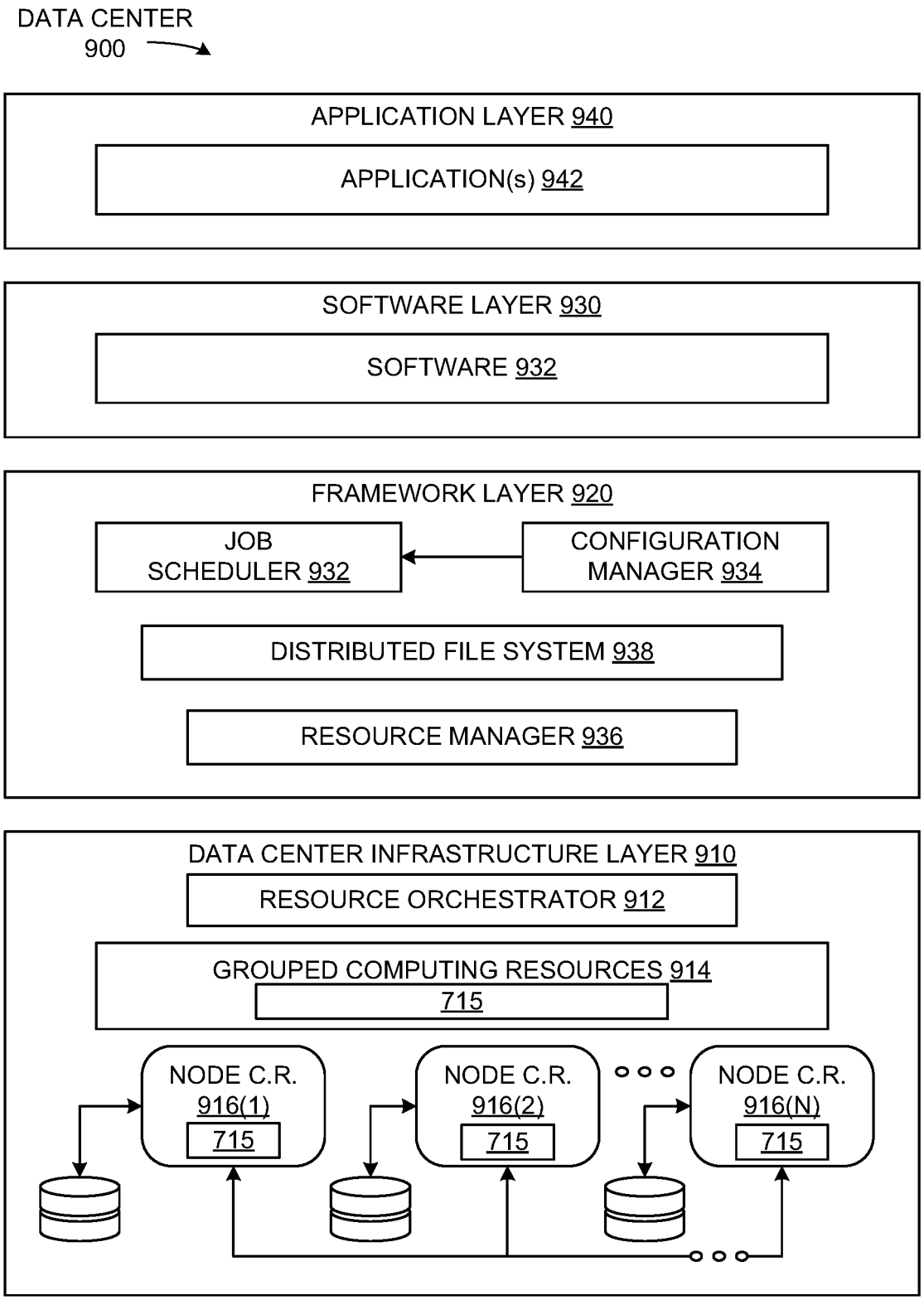
FIG. 9 illustrates a data center system, according to at least one embodiment.

FIG. 9 illustrates an example data center 900, in which at least one embodiment may be used. In at least one embodiment, data center 900 includes a data center infrastructure layer 910, a framework layer 920, a software layer 930, and an application layer 940.

In at least one embodiment, as shown in FIG. 9, data center infrastructure layer 910 may include a resource orchestrator 912, grouped computing resources 914, and node computing resources ("node C.R.s") 916(1)-916(N), where "N" represents any whole, positive integer. In at least one embodiment, node C.R.s 916(1)-916(N) may include, but are not limited to, any number of central processing units ("CPUs") or other processors (including accelerators, field programmable gate arrays (FPGAs), graphics processors, etc.), memory devices (e.g., dynamic read-only memory), storage devices (e.g., solid state or disk drives), network input/output ("NW I/O") devices, network switches, virtual machines ("VMs"), power modules, and cooling modules, etc. In at least one embodiment, one or more node C.R.s from among node C.R.s 916(1)-916(N) may be a server having one or more of above-mentioned computing resources.

In at least one embodiment, grouped computing resources 914 may include separate groupings of node C.R.s housed within one or more racks (not shown), or many racks housed in data centers at various geographical locations (also not shown). Separate groupings of node C.R.s within grouped computing resources 914 may include grouped compute, network, memory or storage resources that may be configured or allocated to support one or more workloads. In at least one embodiment, several node C.R.s including CPUs or processors may grouped within one or more racks to provide compute resources to support one or more workloads. In at least one embodiment, one or more racks may also include any number of power modules, cooling modules, and network switches, in any combination.

In at least one embodiment, resource orchestrator 912 may configure or otherwise control one or more node C.R.s 916(1)-916(N) and/or grouped computing resources 914. In at least one embodiment, resource orchestrator 912 may include a software design infrastructure ("SDI") management entity for data center 900. In at least one embodiment, resource orchestrator may include hardware, software or some combination thereof.

In at least one embodiment, as shown in FIG. 9, framework layer 920 includes a job scheduler 1022, a configuration manager 1024, a resource manager 1026 and a distributed file system 1028. In at least one embodiment, framework layer 920 may include a framework to support software 932 of software layer 930 and/or one or more application(s) 942 of application layer 940. In at least one embodiment, software 932 or application(s) 942 may respectively include web-based service software or applications, such as those provided by Amazon Web Services, Google Cloud and Microsoft Azure. In at least one embodiment, framework layer 920 may be, but is not limited to, a type of free and open-source software web application framework such as Apache Spark™ (hereinafter "Spark") that may utilize distributed file system 1028 for large-scale data processing (e.g., "big data"). In at least one embodiment, job scheduler 1022 may include a Spark driver to facilitate scheduling of workloads supported by various layers of data center 900. In at least one embodiment, configuration manager 1024 may be capable of configuring different layers such as software layer 930 and framework layer 920 including Spark and distributed file system 1028 for supporting large-scale data processing. In at least one embodiment, resource manager 1026 may be capable of managing clustered or grouped computing resources mapped to or allocated for support of distributed file system 1028 and job scheduler 1022. In at least one embodiment, clustered or grouped computing resources may include grouped computing resource 914 at data center infrastructure layer 910. In at least one embodiment, resource manager 1026 may coordinate with resource orchestrator 912 to manage these mapped or allocated computing resources.

In at least one embodiment, software 932 included in software layer 930 may include software used by at least portions of node C.R.s 916(1)-916(N), grouped computing resources 914, and/or distributed file system 1028 of framework layer 920. One or more types of software may include, but are not limited to, Internet web page search software, e-mail virus scan software, database software, and streaming video content software.

In at least one embodiment, application(s) 942 included in application layer 940 may include one or more types of applications used by at least portions of node C.R.s 916(1)-916(N), grouped computing resources 914, and/or distributed file system 1028 of framework layer 920. One or more types of applications may include, but are not limited to, any number of a genomics application, a cognitive compute, and a machine learning application, including training or inferencing software, machine learning framework software (e.g., PyTorch, TensorFlow, Caffe, etc.) or other machine learning applications used in conjunction with one or more embodiments.

In at least one embodiment, any of configuration manager 1024, resource manager 1026, and resource orchestrator 912 may implement any number and type of self-modifying actions based on any amount and type of data acquired in any technically feasible fashion. In at least one embodiment, self-modifying actions may relieve a data center operator of data center 900 from making possibly bad configuration decisions and possibly avoiding underutilized and/or poor performing portions of a data center.

In at least one embodiment, data center 900 may include tools, services, software or other resources to train one or more machine learning models or predict or infer information using one or more machine learning models according to one or more embodiments described herein. For example, in at least one embodiment, a machine learning model may be trained by calculating weight parameters according to a neural network architecture using software and computing resources described above with respect to data center 900. In at least one embodiment, trained machine learning models corresponding to one or more neural networks may be used to infer or predict information using resources described above with respect to data center 900 by using weight parameters calculated through one or more training techniques described herein.

In at least one embodiment, data center may use CPUs, application-specific integrated circuits (ASICs), GPUs, FPGAs, or other hardware to perform training and/or inferencing using above-described resources. Moreover, one or more software and/or hardware resources described above may be configured as a service to allow users to train or performing inferencing of information, such as image recognition, speech recognition, or other artificial intelligence services.

Inference and/or training logic 715 are used to perform inferencing and/or training operations associated with one or more embodiments. Details regarding inference and/or training logic 715 are provided below in conjunction with FIGS. 8 and/or 9. In at least one embodiment, inference and/or training logic 715 may be used in system FIG. 9 for inferencing or predicting operations based, at least in part, on weight parameters calculated using neural network training operations, neural network functions and/or architectures, or neural network use cases described herein. A data center 900 such as that illustrated in FIG. 9 can be used to perform at least some of the processing and/or storage discussed herein remote from a device on which the video is generated or analyzed, or upon which the game is being played. Such a data center may also include servers that host these games or other relevant applications in at least some embodiments.

Computer Systems

Figure 10:
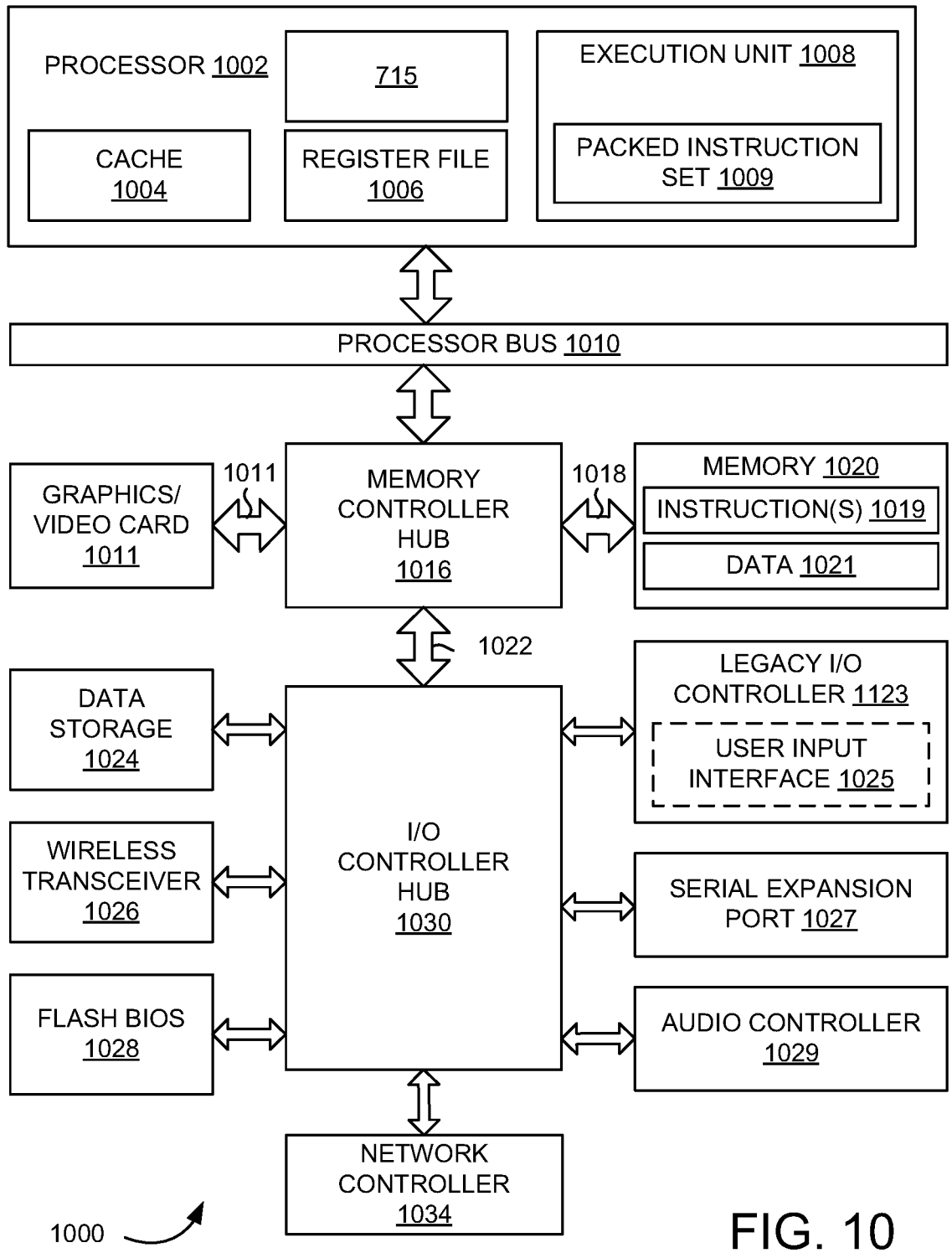
FIG. 10 illustrates a computer system, according to at least one embodiment.

FIG. 10 is a block diagram illustrating an exemplary computer system, which may be a system with interconnected devices and components, a system-on-a-chip (SOC) or some combination thereof 1000 formed with a processor that may include execution units to execute an instruction, according to at least one embodiment. In at least one embodiment, computer system 1000 may include, without limitation, a component, such as a processor 1002 to employ execution units including logic to perform algorithms for process data, in accordance with present disclosure, such as in embodiment described herein. In at least one embodiment, computer system 1000 may include processors, such as PENTIUM® Processor family, Xeon™, Itanium®, XScale™ and/or StrongARM™, Intel® Core™, or Intel® Nervana™ microprocessors available from Intel Corporation of Santa Clara, California, although other systems (including PCs having other microprocessors, engineering workstations, set-top boxes and like) may also be used. In at least one embodiment, computer system 1000 may execute a version of WINDOWS' operating system available from Microsoft Corporation of Redmond, Washington, although other operating systems (UNIX and Linux for example), embedded software, and/or graphical user interfaces, may also be used.

Embodiments may be used in other devices such as handheld devices and embedded applications. Some examples of handheld devices include cellular phones, Internet Protocol devices, digital cameras, personal digital assistants ("PDAs"), and handheld PCs. In at least one embodiment, embedded applications may include a microcontroller, a digital signal processor ("DSP"), system on a chip, network computers ("NetPCs"), set-top boxes, network hubs, wide area network ("WAN") switches, or any other system that may perform one or more instructions in accordance with at least one embodiment.

In at least one embodiment, computer system 1000 may include, without limitation, processor 1002 that may include, without limitation, one or more execution units 1008 to perform machine learning model training and/or inferencing according to techniques described herein. In at least one embodiment, computer system 1000 is a single processor desktop or server system, but in another embodiment computer system 1000 may be a multiprocessor system. In at least one embodiment, processor 1002 may include, without limitation, a complex instruction set computer ("CISC") microprocessor, a reduced instruction set computing ("RISC") microprocessor, a very long instruction word ("VLIW") microprocessor, a processor implementing a combination of instruction sets, or any other processor device, such as a digital signal processor, for example. In at least one embodiment, processor 1002 may be coupled to a processor bus 1010 that may transmit data signals between processor 1002 and other components in computer system 1000.

In at least one embodiment, processor 1002 may include, without limitation, a Level 1 ("L1") internal cache memory ("cache") 1004. In at least one embodiment, processor 1002 may have a single internal cache or multiple levels of internal cache. In at least one embodiment, cache memory may reside external to processor 1002. Other embodiments may also include a combination of both internal and external caches depending on particular implementation and needs. In at least one embodiment, register file 1006 may store different types of data in various registers including, without limitation, integer registers, floating point registers, status registers, and instruction pointer register.

In at least one embodiment, execution unit 1008, including, without limitation, logic to perform integer and floating point operations, also resides in processor 1002. In at least one embodiment, processor 1002 may also include a microcode ("ucode") read only memory ("ROM") that stores microcode for certain macro instructions. In at least one embodiment, execution unit 1008 may include logic to handle a packed instruction set 1009. In at least one embodiment, by including packed instruction set 1009 in an instruction set of a general-purpose processor 1002, along with associated circuitry to execute instructions, operations used by many multimedia applications may be performed using packed data in a general-purpose processor 1002. In one or more embodiments, many multimedia applications may be accelerated and executed more efficiently by using full width of a processor's data bus for performing operations on packed data, which may eliminate need to transfer smaller units of data across processor's data bus to perform one or more operations one data element at a time.

In at least one embodiment, execution unit 1008 may also be used in microcontrollers, embedded processors, graphics devices, DSPs, and other types of logic circuits. In at least one embodiment, computer system 1000 may include, without limitation, a memory 1020. In at least one embodiment, memory 1020 may be implemented as a Dynamic Random Access Memory ("DRAM") device, a Static Random Access Memory ("SRAM") device, flash memory device, or other memory device. In at least one embodiment, memory 1020 may store instruction(s) 1019 and/or data 1021 represented by data signals that may be executed by processor 1002.

In at least one embodiment, system logic chip may be coupled to processor bus 1010 and memory 1020. In at least one embodiment, system logic chip may include, without limitation, a memory controller hub ("MCH") 1016, and processor 1002 may communicate with MCH 1016 via processor bus 1010. In at least one embodiment, MCH 1016 may provide a high bandwidth memory path 1018 to memory 1020 for instruction and data storage and for storage of graphics commands, data and textures. In at least one embodiment, MCH 1016 may direct data signals between processor 1002, memory 1020, and other components in computer system 1000 and to bridge data signals between processor bus 1010, memory 1020, and a system I/O 1022. In at least one embodiment, system logic chip may provide a graphics port for coupling to a graphics controller. In at least one embodiment, MCH 1016 may be coupled to memory 1020 through a high bandwidth memory path 1018 and graphics/video card 1112 may be coupled to MCH 1016 through an Accelerated Graphics Port ("AGP") interconnect 1114.

In at least one embodiment, computer system 1000 may use system I/O 1022 that is a proprietary hub interface bus to couple MCH 1016 to I/O controller hub ("ICH") 1030. In at least one embodiment, ICH 1030 may provide direct connections to some I/O devices via a local I/O bus. In at least one embodiment, local I/O bus may include, without limitation, a high-speed I/O bus for connecting peripherals to memory 1020, chipset, and processor 1002. Examples may include, without limitation, an audio controller 1029, a firmware hub ("flash BIOS") 1028, a wireless transceiver 1026, a data storage 1024, a legacy I/O controller 1023 containing user input and keyboard interfaces 1025, a serial expansion port 1027, such as Universal Serial Bus ("USB"), and a network controller 1034. Data storage 1024 may comprise a hard disk drive, a floppy disk drive, a CD-ROM device, a flash memory device, or other mass storage device.

In at least one embodiment, FIG. 10 illustrates a system, which includes interconnected hardware devices or "chips", whereas in other embodiments, FIG. 10 may illustrate an exemplary System on a Chip ("SoC"). In at least one embodiment, devices illustrated in FIG. 10 may be interconnected with proprietary interconnects, standardized interconnects (e.g., PCIe) or some combination thereof. In at least one embodiment, one or more components of computer system 1000 are interconnected using compute express link (CXL) interconnects.

Inference and/or training logic 715 are used to perform inferencing and/or training operations associated with one or more embodiments. Details regarding inference and/or training logic 715 are provided below in conjunction with FIGS. 8 and/or 9. In at least one embodiment, inference and/or training logic 715 may be used in system FIG. 10 for inferencing or predicting operations based, at least in part, on weight parameters calculated using neural network training operations, neural network functions and/or architectures, or neural network use cases described herein.

In an example use case, there may be a number of players playing in a multiplayer game using a single server, such as may involve using Nvidia GeForce Now on that server. In at least some embodiments, a fluid simulation can be executed within the GeForce Now infrastructure on one or even many computers or client devices, and that fluid state can be shared with the game server. In such a use case, the client devices for the players can provide renderings from their cameras within a given level. Approches discussed herein are thus scalable, and can be executed on many machines in parallel, where each machine can work on its subdomain and performs a respective inference.

Figure 11:
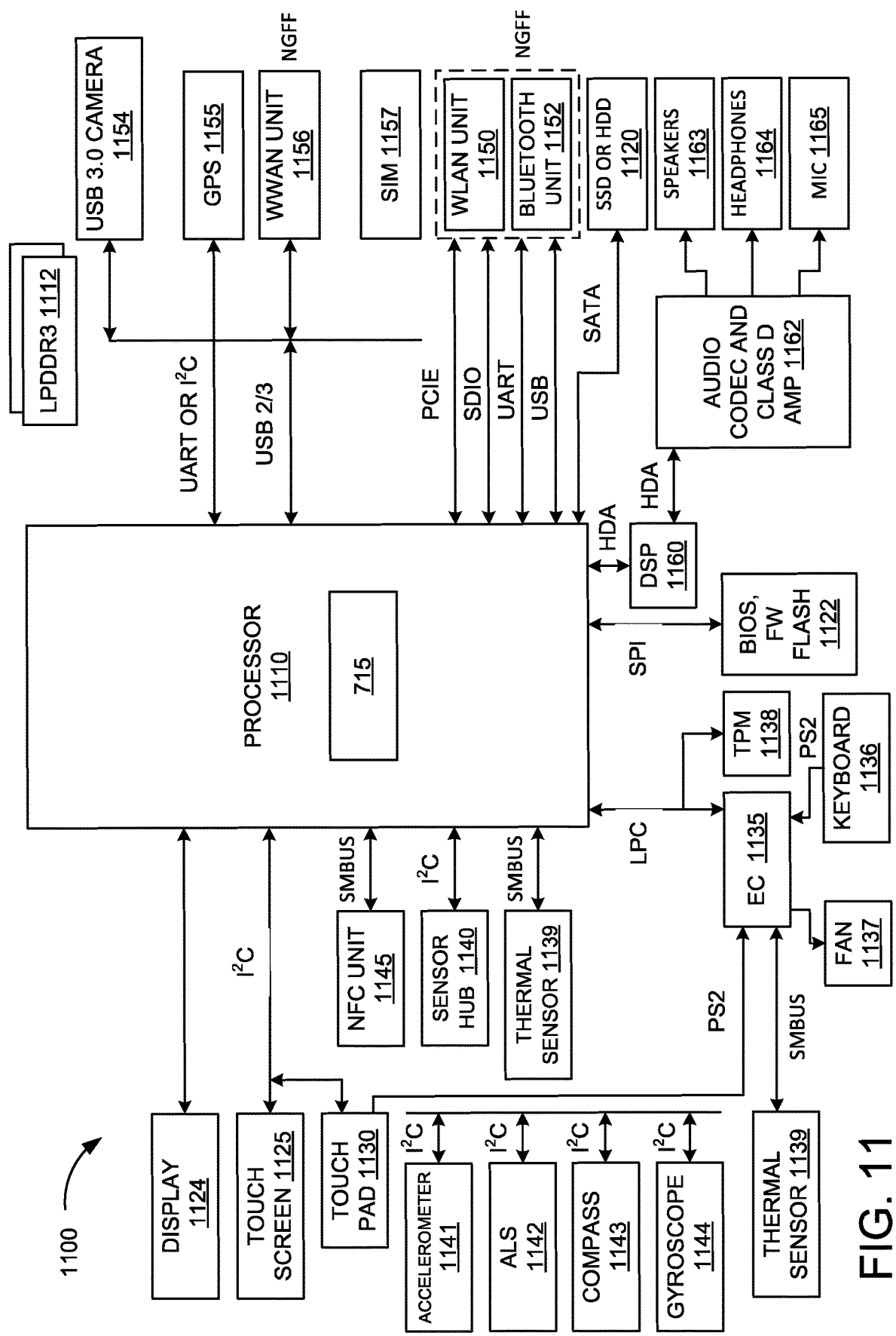
FIG. 11 illustrates a computer system, according to at least one embodiment.

FIG. 11 is a block diagram illustrating an electronic device 1100 for utilizing a processor 1110, according to at least one embodiment. In at least one embodiment, electronic device 1100 may be, for example and without limitation, a notebook, a tower server, a rack server, a blade server, a laptop, a desktop, a tablet, a mobile device, a phone, an embedded computer, or any other suitable electronic device.

In at least one embodiment, system 1100 may include, without limitation, processor 1110 communicatively coupled to any suitable number or kind of components, peripherals, modules, or devices. In at least one embodiment, processor 1110 coupled using a bus or interface, such as a 1° C. bus, a System Management Bus ("SMBus"), a Low Pin Count (LPC) bus, a Serial Peripheral Interface ("SPI"), a High Definition Audio ("HDA") bus, a Serial Advance Technology Attachment ("SATA") bus, a Universal Serial Bus ("USB") (versions 1, 2, 3), or a Universal Asynchronous Receiver/Transmitter ("UART") bus. In at least one embodiment, FIG. 11 illustrates a system, which includes interconnected hardware devices or "chips", whereas in other embodiments, FIG. 11 may illustrate an exemplary System on a Chip ("SoC"). In at least one embodiment, devices illustrated in FIG. 11 may be interconnected with proprietary interconnects, standardized interconnects (e.g., PCIe) or some combination thereof. In at least one embodiment, one or more components of FIG. 11 are interconnected using compute express link (CXL) interconnects.

Figure 12:
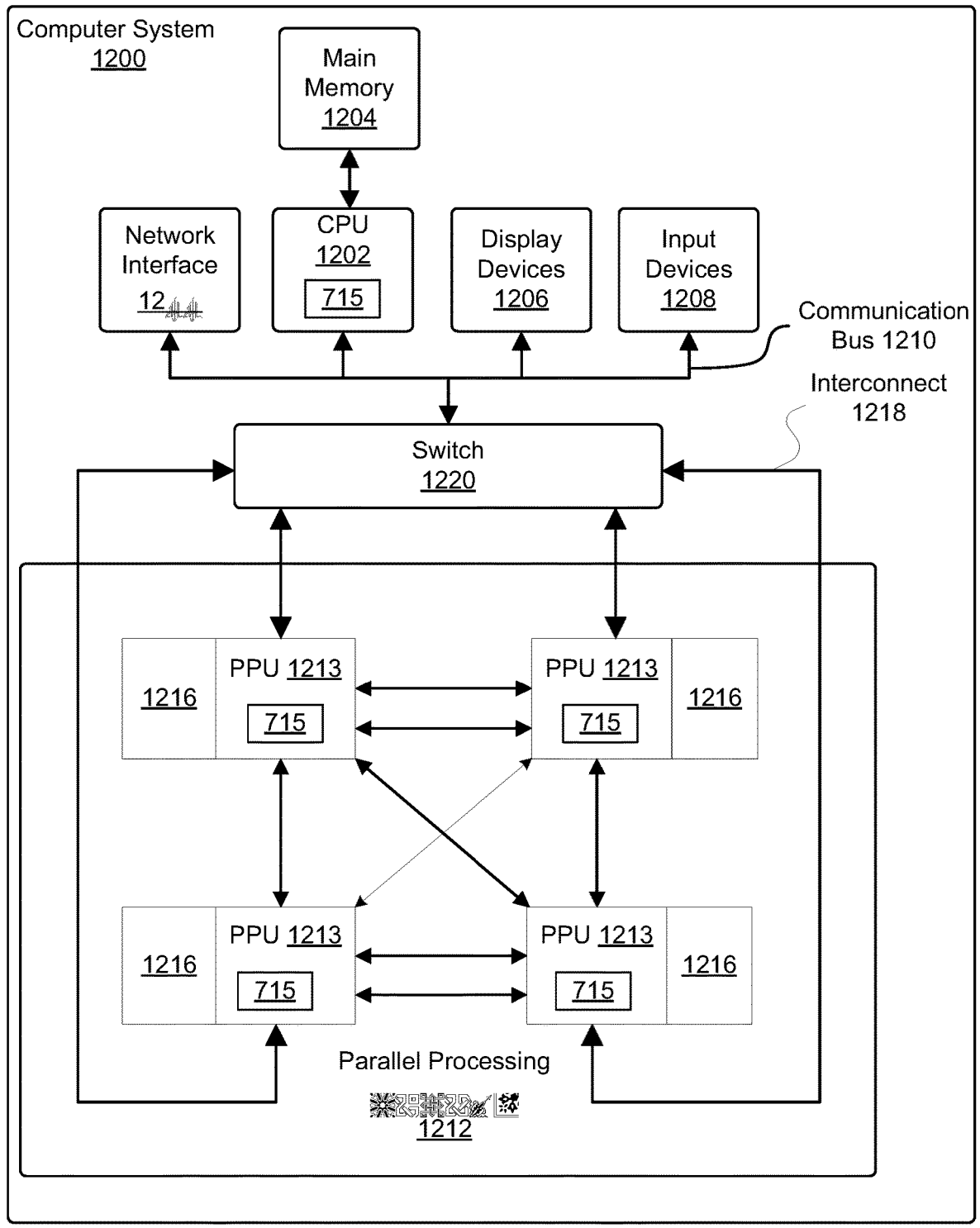
FIG. 12 illustrates a computer system, according to at least one embodiment.

In at least one embodiment, FIG. 12 may include a display 1124, a touch screen 1125, a touch pad 1130, a Near Field Communications unit ("NFC") 1145, a sensor hub 1140, a thermal sensor 1246, an Express Chipset ("EC") 1135, a Trusted Platform Module ("TPM") 1138, BIOS/firmware/flash memory ("BIOS, FW Flash") 1122, a DSP 1160, a drive 1120 such as a Solid State Disk ("SSD") or a Hard Disk Drive ("HDD"), a wireless local area network unit ("WLAN") 1150, a Bluetooth unit 1152, a Wireless Wide Area Network unit ("WWAN") 1156, a Global Positioning System (GPS) 1155, a camera ("USB 3.0 camera") 1154 such as a USB 3.0 camera, and/or a Low Power Double Data Rate ("LPDDR") memory unit ("LPDDR3") 1112 implemented in, for example, LPDDR3 standard. These components may each be implemented in any suitable manner.

In at least one embodiment, other components may be communicatively coupled to processor 1110 through components discussed above. In at least one embodiment, an accelerometer 1141, Ambient Light Sensor ("ALS") 1142, compass 1143, and a gyroscope 1144 may be communicatively coupled to sensor hub 1140. In at least one embodiment, thermal sensor 1139, a fan 1137, a keyboard 1246, and a touch pad 1130 may be communicatively coupled to EC 1135. In at least one embodiment, speaker 1163, headphones 1164, and microphone ("mic") 1165 may be communicatively coupled to an audio unit ("audio codec and class d amp") 1162, which may in turn be communicatively coupled to DSP 1160. In at least one embodiment, audio unit 1164 may include, for example and without limitation, an audio coder/decoder ("codec") and a class D amplifier. In at least one embodiment, SIM card ("SIM") 1157 may be communicatively coupled to WWAN unit 1156. In at least one embodiment, components such as WLAN unit 1150 and Bluetooth unit 1152, as well as WWAN unit 1156 may be implemented in a Next Generation Form Factor ("NGFF").

Inference and/or training logic 715 are used to perform inferencing and/or training operations associated with one or more embodiments. Details regarding inference and/or training logic 715 are provided below in conjunction with FIGS. 8 and/or 9. In at least one embodiment, inference and/or training logic 715 may be used in system FIG. 11 for inferencing or predicting operations based, at least in part, on weight parameters calculated using neural network training operations, neural network functions and/or architectures, or neural network use cases described herein.

FIG. 12 illustrates a computer system 1200, according to at least one embodiment. In at least one embodiment, computer system 1200 is configured to implement various processes and methods described throughout this disclosure.

In at least one embodiment, computer system 1200 comprises, without limitation, at least one central processing unit ("CPU") 1202 that is connected to a communication bus 1210 implemented using any suitable protocol, such as PCI ("Peripheral Component Interconnect"), peripheral component interconnect express ("PCI-Express"), AGP ("Accelerated Graphics Port"), HyperTransport, or any other bus or point-to-point communication protocol(s). In at least one embodiment, computer system 1200 includes, without limitation, a main memory 1204 and control logic (e.g., implemented as hardware, software, or a combination thereof) and data are stored in main memory 1204 which may take form of random access memory ("RAM"). In at least one embodiment, a network interface subsystem ("network interface") 1222 provides an interface to other computing devices and networks for receiving data from and transmitting data to other systems from computer system 1200.

In at least one embodiment, computer system 1200, in at least one embodiment, includes, without limitation, input devices 1208, parallel processing system 1212, and display devices 1206 which can be implemented using a cathode ray tube ("CRT"), liquid crystal display ("LCD"), light emitting diode ("LED"), plasma display, or other suitable display technologies. In at least one embodiment, user input is received from input devices 1208 such as keyboard, mouse, touchpad, microphone, and more. In at least one embodiment, each of foregoing modules can be situated on a single semiconductor platform to form a processing system.

Inference and/or training logic 715 are used to perform inferencing and/or training operations associated with one or more embodiments. Details regarding inference and/or training logic 715 are provided below in conjunction with FIGS. 8 and/or 9. In at least one embodiment, inference and/or training logic 715 may be used in system FIG. 12 for inferencing or predicting operations based, at least in part, on weight parameters calculated using neural network training operations, neural network functions and/or architectures, or neural network use cases described herein.

Figure 13:
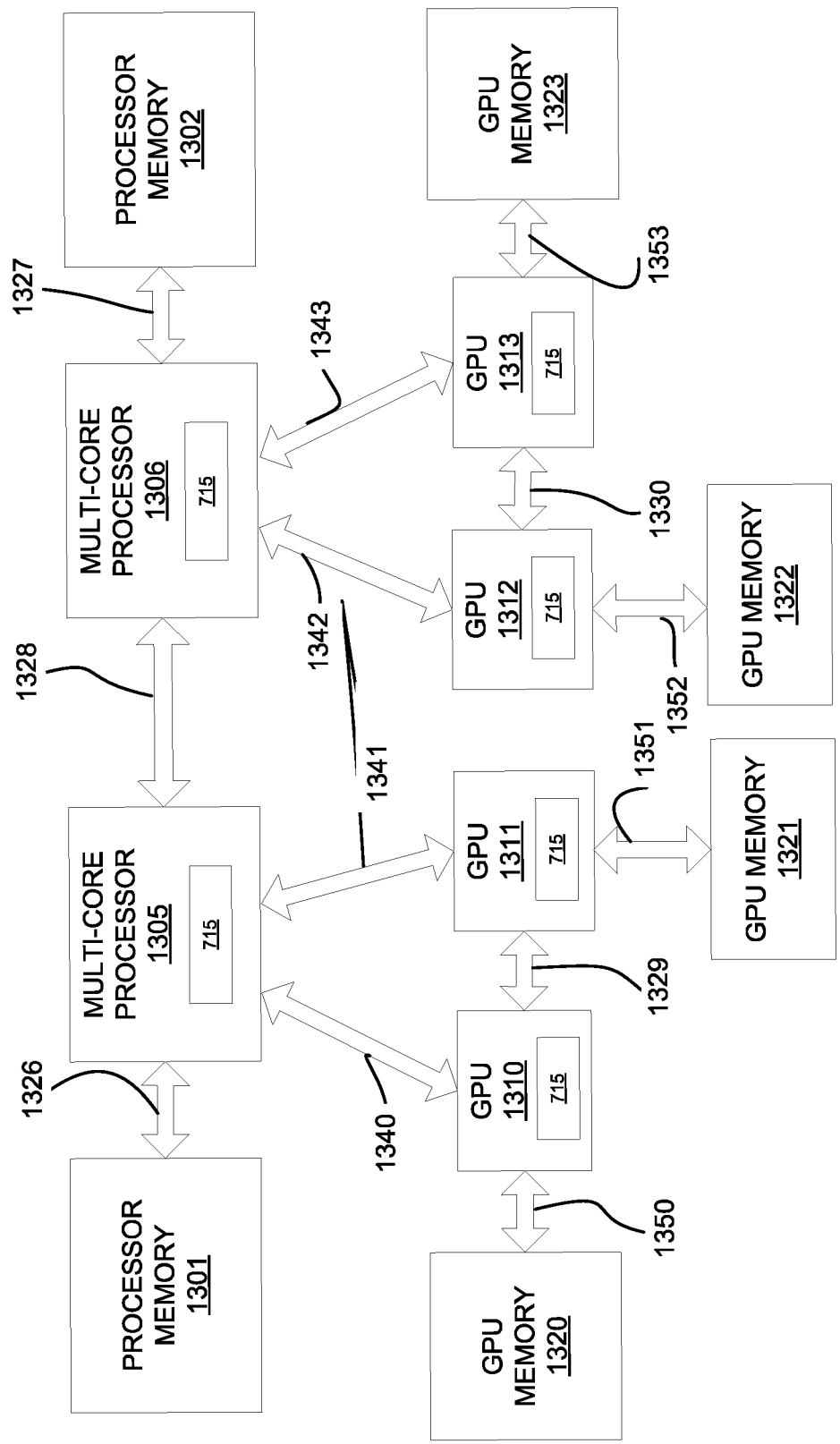
FIG. 13 illustrates a computer system, according to at least one embodiment.

FIG. 13 illustrates an exemplary architecture in which a plurality of GPUs 1310-1313 is communicatively coupled to a plurality of multi-core processors 1305-1306 over high-speed links 1340-1343 (e.g., buses, point-to-point interconnects, etc.). In one embodiment, high-speed links 1340-1343 support a communication throughput of 4 GB/s, 30 GB/s, 80 GB/s or higher. Various interconnect protocols may be used including, but not limited to, PCIe 4.0 or 5.0 and NVLink 2.0.

In addition, and in one embodiment, two or more of GPUs 1310-1313 are interconnected over high-speed links 1329-1330, which may be implemented using same or different protocols/links than those used for high-speed links 1340-1343. Similarly, two or more of multi-core processors 1305-1306 may be connected over high speed link 1328 which may be symmetric multi-processor (SMP) buses operating at 20 GB/s, 30 GB/s, 120 GB/s or higher. Alternatively, all communication between various system components shown in FIG. 13 may be accomplished using same protocols/links (e.g., over a common interconnection fabric).

In one embodiment, each multi-core processor 1305-1306 is communicatively coupled to a processor memory 1301-1302, via memory interconnects 1326-1327, respectively, and each GPU 1310-1313 is communicatively coupled to GPU memory 1320-1323 over GPU memory interconnects 1350-1353, respectively. Memory interconnects 1326-1327 and 1350-1353 may utilize same or different memory access technologies. By way of example, and not limitation, processor memories 1301-1302 and GPU memories 1320-1323 may be volatile memories such as dynamic random access memories (DRAMs) (including stacked DRAMs), Graphics DDR SDRAM (GDDR) (e.g., GDDR5, GDDR6), or High Bandwidth Memory (HBM) and/or may be non-volatile memories such as 3D XPoint or Nano-Ram. In one embodiment, some portion of processor memories 1301-1302 may be volatile memory and another portion may be non-volatile memory (e.g., using a two-level memory (2LM) hierarchy).

As described below, although various processors 1305-1306 and GPUs 1310-1313 may be physically coupled to a particular memory 1301-1302, 1320-1323, respectively, a unified memory architecture may be implemented in which a same virtual system address space (also referred to as "effective address" space) is distributed among various physical memories. For example, processor memories 1301-1302 may each comprise 64 GB of system memory address space and GPU memories 1320-1323 may each comprise 32 GB of system memory address space (resulting in a total of 256 GB addressable memory in this example).

FIG. 13 illustrates additional details for an interconnection between a multi-core processor 1407 and a graphics acceleration module 1446 in accordance with one exemplary embodiment. Graphics acceleration module 1446 may include one or more GPU chips integrated on a line card which is coupled to processor 1407 via high-speed link 1340. Alternatively, graphics acceleration module 1446 may be integrated on a same package or chip as processor 1407.

In at least one embodiment, illustrated processor 1407 includes a plurality of cores 1460A-1460D, each with a translation lookaside buffer 1461A-1461D and one or more caches 1462A-1462D. In at least one embodiment, cores 1460A-1460D may include various other components for executing instructions and processing data which are not illustrated. Caches 1462A-1462D may comprise level 1 (L1) and level 2 (L2) caches. In addition, one or more shared caches 1456 may be included in caches 1462A-1462D and shared by sets of cores 1460A-1460D. For example, one embodiment of processor 1407 includes 24 cores, each with its own L1 cache, twelve shared L2 caches, and twelve shared L3 caches. In this embodiment, one or more L2 and L3 caches are shared by two adjacent cores. Processor 1407 and graphics acceleration module 1446 connect with system memory 1414, which may include processor memories 1301-1302 of FIG. 13.

Figure 14:
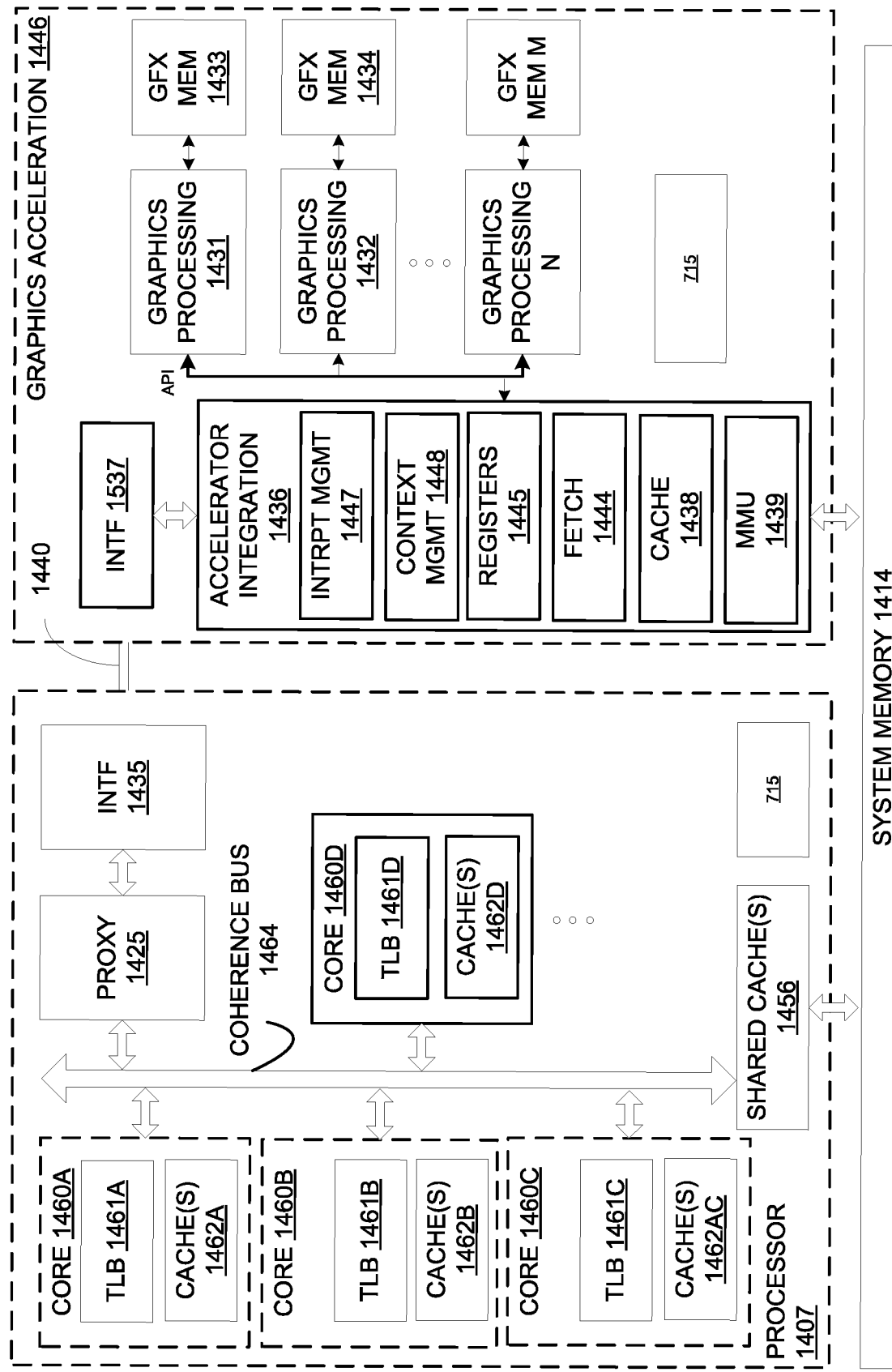
FIG. 14 illustrates a computer system, according to at least one embodiment.

Coherency is maintained for data and instructions stored in various caches 1462A-1462D, 1456 and system memory 1514 via inter-core communication over a coherence bus 1464 as illustrated in FIG. 14. For example, each cache may have cache coherency logic/circuitry associated therewith to communicate to over coherence bus 1464 in response to detected reads or writes to particular cache lines. In one implementation, a cache snooping protocol is implemented over coherence bus 1464 to snoop cache accesses.

In one embodiment, a proxy circuit 1425 communicatively couples graphics acceleration module 1446 to coherence bus 1464, allowing graphics acceleration module 1446 to participate in a cache coherence protocol as a peer of cores 1460A-1460D. In particular, an interface 1435 provides connectivity to proxy circuit 1425 over high-speed link 1440 (e.g., a PCIe bus, NVLink, etc.) and an interface 1437 connects graphics acceleration module 1446 to link 1440.

In one implementation, an accelerator integration circuit 1436 provides cache management, memory access, context management, and interrupt management services on behalf of a plurality of graphics processing engines 1431, 1432, N of graphics acceleration module 1446. Graphics processing engines 1431, 1432, N may each comprise a separate graphics processing unit (GPU). Alternatively, graphics processing engines 1431, 1432, N may comprise different types of graphics processing engines within a GPU such as graphics execution units, media processing engines (e.g., video encoders/decoders), samplers, and blit engines. In at least one embodiment, graphics acceleration module 1446 may be a GPU with a plurality of graphics processing engines 1431-1432, N or graphics processing engines 1431-1432, N may be individual GPUs integrated on a common package, line card, or chip.

In one embodiment, accelerator integration circuit 1436 includes a memory management unit (MMU) 1439 for performing various memory management functions such as virtual-to-physical memory translations (also referred to as effective-to-real memory translations) and memory access protocols for accessing system memory 1514. MMU 1439 may also include a translation lookaside buffer (TLB) (not shown) for caching virtual/effective to physical/real address translations. In one implementation, a cache 1438 stores commands and data for efficient access by graphics processing engines 1431-1432, N. In one embodiment, data stored in cache 1438 and graphics memories 1433-1434, M is kept coherent with core caches 1462A-1462D, 1456, and system memory 1514. As mentioned above, this may be accomplished via proxy circuit 1425 on behalf of cache 1438 and memories 1433-1434, M (e.g., sending updates to cache 1438 related to modifications/accesses of cache lines on processor caches 1462A-1462D, 1456, and receiving updates from cache 1438).

A set of registers 1445 in FIG. 14 store context data for threads executed by graphics processing engines 1431-1432, N and a context management circuit 1448 manages thread contexts. For example, context management circuit 1448 may perform save and restore operations to save and restore contexts of various threads during contexts switches (e.g., where a first thread is saved and a second thread is stored so that a second thread can be executed by a graphics processing engine). For example, on a context switch, context management circuit 1448 may store current register values to a designated region in memory (e.g., identified by a context pointer). It may then restore register values when returning to a context. In one embodiment, an interrupt management circuit 1447 receives and processes interrupts received from system devices.

In one implementation, virtual/effective addresses from a graphics processing engine 1431 are translated to real/physical addresses in system memory 1514 by MMU 1439. One embodiment of accelerator integration circuit 1436 supports multiple (e.g., 4, 8, 16) graphics accelerator modules 1446 and/or other accelerator devices. Graphics accelerator module 1446 may be dedicated to a single application executed on processor 1407 or may be shared between multiple applications. In one embodiment, a virtualized graphics execution environment is presented in which resources of graphics processing engines 1431-1432, N are shared with multiple applications or virtual machines (VMs). In at least one embodiment, resources may be subdivided into "slices" which are allocated to different VMs and/or applications based on processing requirements and priorities associated with VMs and/or applications.

In at least one embodiment, accelerator integration circuit 1436 performs as a bridge to a system for graphics acceleration module 1446 and provides address translation and system memory cache services. In addition, accelerator integration circuit 1436 may provide virtualization facilities for a host processor to manage virtualization of graphics processing engines 1431-1432, N, interrupts, and memory management.

Because hardware resources of graphics processing engines 1431-1432, N are mapped explicitly to a real address space seen by host processor 1407, any host processor can address these resources directly using an effective address value. One function of accelerator integration circuit 1436, in one embodiment, is physical separation of graphics processing engines 1431-1432, N so that they appear to a system as independent units.

In at least one embodiment, one or more graphics memories 1433-1434, M are coupled to each of graphics processing engines 1431-1432, N, respectively. Graphics memories 1433-1434, M store instructions and data being processed by each of graphics processing engines 1431-1432, N. Graphics memories 1433-1434, M may be volatile memories such as DRAMs (including stacked DRAMs), GDDR memory (e.g., GDDR5, GDDR6), or HBM, and/or may be non-volatile memories such as 3D XPoint or Nano-Ram.

In one embodiment, to reduce data traffic over link 1440, biasing techniques are used to ensure that data stored in graphics memories 1433-1434, M is data which will be used most frequently by graphics processing engines 1431-1432, N and preferably not used by cores 1460A-1460D (at least not frequently). Similarly, a biasing mechanism attempts to keep data needed by cores (and preferably not graphics processing engines 1431-1432, N) within caches 1462A-1462D, 1456 of cores and system memory 1514.

In at least one embodiment, a single semiconductor platform may refer to a sole unitary semiconductor-based integrated circuit or chip. In at least one embodiment, multi-chip modules may be used with increased connectivity which simulate on-chip operation, and make substantial improvements over utilizing a central processing unit ("CPU") and bus implementation. In at least one embodiment, various modules may also be situated separately or in various combinations of semiconductor platforms per desires of user.

In at least one embodiment, computer programs in form of machine-readable executable code or computer control logic algorithms are stored in main memory 1404 and/or secondary storage. Computer programs, if executed by one or more processors, enable system 1400 to perform various functions in accordance with at least one embodiment. In at least one embodiment, memory 1404, storage, and/or any other storage are possible examples of computer-readable media. In at least one embodiment, secondary storage may refer to any suitable storage device or system such as a hard disk drive and/or a removable storage drive, representing a floppy disk drive, a magnetic tape drive, a compact disk drive, digital versatile disk ("DVD") drive, recording device, universal serial bus ("USB") flash memory, etc. In at least one embodiment, architecture and/or functionality of various previous figures are implemented in context of CPU; parallel processing system; an integrated circuit capable of at least a portion of capabilities of both CPU; parallel processing system; a chipset (e.g., a group of integrated circuits designed to work and sold as a unit for performing related functions, etc.); and any suitable combination of integrated circuit(s).

In at least one embodiment, architecture and/or functionality of various previous figures are implemented in context of a general computer system, a circuit board system, a game console system dedicated for entertainment purposes, an application-specific system, and more. In at least one embodiment, computer system may take form of a desktop computer, a laptop computer, a tablet computer, servers, supercomputers, a smart-phone (e.g., a wireless, hand-held device), personal digital assistant ("PDA"), a digital camera, a vehicle, a head mounted display, a hand-held electronic device, a mobile phone device, a television, workstation, game consoles, embedded system, and/or any other type of logic. Such hardware can be used to execute applications and code to support various types of processing, analysis, and storage discussed herein. For example, a given computer system might execute a game and analyze video output by the game to determine events, and then upload this event data to a remote server for analysis or storage. In other embodiments, a stream of video data might be generated by a gaming server that hosts a game involving several different client devices, and this stream might be analyzed by another server or computer system for determining events that occurred within gameplay. In some embodiments, this event data can then be used by the same, or yet another, server or computer system for processing, such as to generate a highlight video or video montage.

Other variations are within spirit of present disclosure. Thus, while disclosed techniques are susceptible to various modifications and alternative constructions, certain illustrated embodiments thereof are shown in drawings and have been described above in detail. It should be understood, however, that there is no intention to limit disclosure to specific form or forms disclosed, but on contrary, intention is to cover all modifications, alternative constructions, and equivalents falling within spirit and scope of disclosure, as defined in appended claims.

Use of terms "a" and "an" and "the" and similar referents in context of describing disclosed embodiments (especially in context of following claims) are to be construed to cover both singular and plural, unless otherwise indicated herein or clearly contradicted by context, and not as a definition of a term. Terms "comprising," "having," "including," and "containing" are to be construed as open-ended terms (meaning "including, but not limited to,") unless otherwise noted. Term "connected," when unmodified and referring to physical connections, is to be construed as partly or wholly contained within, attached to, or joined together, even if there is something intervening. Recitation of ranges of values herein are merely intended to serve as a shorthand method of referring individually to each separate value falling within range, unless otherwise indicated herein and each separate value is incorporated into specification as if it were individually recited herein. Use of term "set" (e.g., "a set of items") or "subset," unless otherwise noted or contradicted by context, is to be construed as a nonempty collection comprising one or more members. Further, unless otherwise noted or contradicted by context, term "subset" of a corresponding set does not necessarily denote a proper subset of corresponding set, but subset and corresponding set may be equal.

Conjunctive language, such as phrases of form "at least one of A, B, and C," or "at least one of A, B and C," unless specifically stated otherwise or otherwise clearly contradicted by context, is otherwise understood with context as used in general to present that an item, term, etc., may be either A or B or C, or any nonempty subset of set of A and B and C. For instance, in illustrative example of a set having three members, conjunctive phrases "at least one of A, B, and C" and "at least one of A, B and C" refer to any of following sets: {A}, {B}, {C}, {A, B}, {A, C}, {B, C}, {A, B, C}. Thus, such conjunctive language is not generally intended to imply that certain embodiments require at least one of A, at least one of B, and at least one of C each to be present. In addition, unless otherwise noted or contradicted by context, term "plurality" indicates a state of being plural (e.g., "a plurality of items" indicates multiple items). A plurality is at least two items, but can be more when so indicated either explicitly or by context. Further, unless stated otherwise or otherwise clear from context, phrase "based on" means "based at least in part on" and not "based solely on."

Operations of processes described herein can be performed in any suitable order unless otherwise indicated herein or otherwise clearly contradicted by context. In at least one embodiment, a process such as those processes described herein (or variations and/or combinations thereof) is performed under control of one or more computer systems configured with executable instructions and is implemented as code (e.g., executable instructions, one or more computer programs or one or more applications) executing collectively on one or more processors, by hardware or combinations thereof. In at least one embodiment, code is stored on a computer-readable storage medium, for example, in form of a computer program comprising a plurality of instructions executable by one or more processors. In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (i.e., as a result of being executed) by one or more processors of a computer system, cause computer system to perform operations described herein. A set of non-transitory computer-readable storage media, in at least one embodiment, comprises multiple non-transitory computer-readable storage media and one or more of individual non-transitory storage media of multiple non-transitory computer-readable storage media lack all of code while multiple non-transitory computer-readable storage media collectively store all of code. In at least one embodiment, executable instructions are executed such that different instructions are executed by different processors— for example, a non-transitory computer-readable storage medium store instructions and a main central processing unit ("CPU") executes some of instructions while a graphics processing unit ("GPU") executes other instructions. In at least one embodiment, different components of a computer system have separate processors and different processors execute different subsets of instructions.

Accordingly, in at least one embodiment, computer systems are configured to implement one or more services that singly or collectively perform operations of processes described herein and such computer systems are configured with applicable hardware and/or software that enable performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples, or exemplary language (e.g., "such as") provided herein, is intended merely to better illuminate embodiments of disclosure and does not pose a limitation on scope of disclosure unless otherwise claimed. No language in specification should be construed as indicating any non-claimed element as essential to practice of disclosure.

All references, including publications, patent applications, and patents, cited herein are hereby incorporated by reference to same extent as if each reference were individually and specifically indicated to be incorporated by reference and were set forth in its entirety herein.

In description and claims, terms "coupled" and "connected," along with their derivatives, may be used. It should be understood that these terms may be not intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification terms such as "processing," "computing," "calculating," "determining," or like, refer to action and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

In a similar manner, term "processor" may refer to any device or portion of a device that processes electronic data from registers and/or memory and transform that electronic data into other electronic data that may be stored in registers and/or memory. As non-limiting examples, "processor" may be a CPU or a GPU. A "computing platform" may comprise one or more processors. As used herein, "software" processes may include, for example, software and/or hardware entities that perform work over time, such as tasks, threads, and intelligent agents. Also, each process may refer to multiple processes, for carrying out instructions in sequence or in parallel, continuously or intermittently. Terms "system" and "method" are used herein interchangeably insofar as system may embody one or more methods and methods may be considered a system.

In present document, references may be made to obtaining, acquiring, receiving, or inputting analog or digital data into a subsystem, computer system, or computer-implemented machine. Obtaining, acquiring, receiving, or inputting analog and digital data can be accomplished in a variety of ways such as by receiving data as a parameter of a function call or a call to an application programming interface. In some implementations, process of obtaining, acquiring, receiving, or inputting analog or digital data can be accomplished by transferring data via a serial or parallel interface. In another implementation, process of obtaining, acquiring, receiving, or inputting analog or digital data can be accomplished by transferring data via a computer network from providing entity to acquiring entity. References may also be made to providing, outputting, transmitting, sending, or presenting analog or digital data. In various examples, process of providing, outputting, transmitting, sending, or presenting analog or digital data can be accomplished by transferring data as an input or output parameter of a function call, a parameter of an application programming interface or interprocess communication mechanism.

Although discussion above sets forth example implementations of described techniques, other architectures (neural network or otherwise) may be used to implement described functionality, and are intended to be within scope of this disclosure. Furthermore, although specific distributions of responsibilities are defined above for purposes of discussion, various functions and responsibilities might be distributed and divided in different ways, depending on circumstances.

Furthermore, although subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

What is claimed is:

1. A computer-implemented method, comprising:
   determining, for a set of frames, a simulation to be performed on particles located in a domain, the set of frames including at least a first frame and a second frame;
   obtaining, for the first frame, motion information of each particle located in the domain, the motion information including a first position and a first velocity;
   determining a final position and a final velocity of each particle in the domain at an end of the first frame based at least in part on the motion information and one or more tensors associated with the particles; and
   performing, using one or more processors, the simulation for the first frame and the second frame based at least in part on the final position and the final velocity of each particle.

2. The computer-implemented method of claim 1, wherein the obtaining the motion information comprises:
   determining a set of external forces applied to each of the particles in the first frame, the motion information being obtained based at least in part on the set of external forces.

3. The computer-implemented method of claim 2, wherein the obtaining the motion information comprises:
   determining the final velocity of each particle in the domain at the end of the first frame based at least in part on the first velocity and the set of external forces.

4. The computer-implemented method of claim 1, wherein the one or more tensors comprise:
   at least a density tensor and a rigid body mask tensor for the particles located in the domain.

5. The computer-implemented method of claim 4, further comprising generating the density tensor by:
   spatially dividing the domain into voxels according to at least one capability of one or more processors to perform the simulation, each of the voxels representing subvolumes of particles for the simulation;
   determining a number of particles located within each of the voxels based at least in part on an incompressibility constraint; and
   generating the density tensor as a position map of the particles located in the domain based at least in part on the number of particles determined for each of the voxels.

6. The computer-implemented method of claim 5, wherein the determining the final position and the final velocity of each particle in the domain at an end of the first frame comprises:
   inputting the density tensor as a first channel and the rigid body mask tensor as a second channel into a network, the network having three spatial dimensions; and
   obtaining, using the one or more processors, an intermediate tensor for the set of frames based at least in part on the first channel and the second channel; and
   obtaining, using the one or more processors, a correction factor for each of the particles based at least in part on a depth-to-space operation and the intermediate tensor.

7. The computer-implemented method of claim 1, further comprising outputting the final position and the final velocity of each particle in the domain for use in the second frame.

8. A system comprising:
   one or more processors; and
   memory including instructions that, when executed by the one or more processors, cause the system to:
   determine, for a set of frames, a simulation to be performed on particles located in a domain, the set of frames including at least a first frame and a second frame;
   obtain, for the first frame, motion information of each particle located in the domain, the motion information including a first position and a first velocity;
   determine a final position and a final velocity of each particle in the domain at an end of the first frame based at least in part on the motion information and one or more tensors associated with the particles; and
   perform, using one or more processors, the simulation for the first frame and the second frame based at least in part on the final position and the final velocity of each particle.

9. The system of claim 8, wherein the obtaining the motion information comprises:
   determining a set of external forces applied to each of the particles in the first frame, the motion information being obtained based at least in part on the set of external forces.

10. The system of claim 9, wherein the one or more processors are configured to obtain the motion information by:
    determining the final velocity of each particle in the domain at the end of the first frame based at least in part on the first velocity and the set of external forces.

11. The system of claim 8, wherein the one or more tensors comprise at least a density tensor for the first frame.

12. The system of claim 11, wherein the one or more processors are configured to generate the density tensor for the first frame by:
    spatially dividing the domain into voxels according to at least one capability of one or more processors to perform the simulation, each of the voxels representing subvolumes of particles for the simulation;
    determining a number of particles located within each of the voxels based at least in part on an incompressibility constraint; and
    generating the density tensor as a position map of the particles located in the domain based at least in part on the number of particles determined for each of the voxels.

13. The system of claim 8, wherein the one or more processors are configured to output the final position and the final velocity of each particle in the domain for use in the second frame.

14. The system of claim 8, wherein the one or more processors are configured to determine the final position and the final velocity of each particle in the domain at an end of the first frame by:
   inputting a density tensor as a first channel and a rigid body mask tensor as a second channel into a network, the network having three spatial dimensions; and
   obtaining, using the one or more processors, an intermediate tensor for the set of frames based at least in part on the first channel and the second channel; and
   obtaining, using the one or more processors, a correction factor for each of the particles based at least in part on a depth-to-space operation and the intermediate tensor.

15. A non-transitory machine-readable medium having stored thereon a set of instructions, which if performed by one or more processors, cause the one or more processors to at least:
   determine, for a set of frames, a simulation to be performed on particles located in a domain, the set of frames including at least a first frame and a second frame;
   obtain, for the first frame, motion information of each particle located in the domain, the motion information including a first position and a first velocity;
   determine a final position and a final velocity of each particle in the domain at an end of the first frame based at least in part on the motion information and one or more tensors associated with the particles; and
   perform, using one or more processors, the simulation for the first frame and the second frame based at least in part on the final position and the final velocity of each particle.

16. The non-transitory machine-readable medium of claim 15, wherein the obtaining the motion information comprises:
   determining a set of external forces applied to each of the particles in the first frame, the motion information being obtained based at least in part on the set of external forces.

17. The non-transitory machine-readable medium of claim 16, wherein the one or more tensors comprise at least a density tensor and a rigid body mask tensor for the particles located in the domain.

18. The non-transitory machine-readable medium of claim 17, wherein instructions when performed further cause the one or more processors to generate the density tensor by:
   spatially dividing the domain into voxels according to at least one capability of one or more processors to perform the simulation, each of the voxels representing subvolumes of particles for the simulation;
   determining a number of particles located within each of the voxels based at least in part on an incompressibility constraint; and
   generating the density tensor as a position map of the particles located in the domain based at least in part on the number of particles determined for each of the voxels.

19. The non-transitory machine-readable medium of claim 18, wherein instructions when performed further cause the one or more processors to determine the final position and the final velocity of each particle in the domain at an end of the first frame by:
   inputting the density tensor as a first channel and the rigid body mask tensor as a second channel into a network, the network having three spatial dimensions; and
   obtaining, using the one or more processors, an intermediate tensor for the set of frames based at least in part on the first channel and the second channel; and
   obtaining, using the one or more processors, a correction factor for each of the particles based at least in part on a depth-to-space operation and the intermediate tensor.

20. The non-transitory machine-readable medium of claim 15, wherein instructions when performed further cause the one or more processors to output the final position and the final velocity of each particle in the domain for use in the second frame.

\* \* \* \* \*